United States Patent
Huang et al.

(10) Patent No.: US 12,495,598 B2
(45) Date of Patent: Dec. 9, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: I-Wen Huang, Taipei (TW); Ching-Feng Fu, Taichung (TW); Guan-Ren Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 651 days.

(21) Appl. No.: 17/870,775

(22) Filed: Jul. 21, 2022

(65) Prior Publication Data
US 2024/0030299 A1   Jan. 25, 2024

(51) Int. Cl.
| H01L 29/417 | (2006.01) |
| H01L 21/285 | (2006.01) |
| H01L 21/768 | (2006.01) |
| H10D 64/23 | (2025.01) |

(52) U.S. Cl.
CPC ..... H10D 64/258 (2025.01); H01L 21/28518 (2013.01); H01L 21/7684 (2013.01); H01L 21/76877 (2013.01); H01L 21/76897 (2013.01)

(58) Field of Classification Search
CPC ...... H10D 64/251–259; H10D 30/6729–6739; H10D 30/6219; H10D 64/647–649; H10D 64/258; H01L 21/28518; H01L 21/7684; H01L 21/76877; H01L 21/76897; H01L 21/76805; H01L 23/528; H01L 23/53295; H01L 21/76816
See application file for complete search history.

(56) References Cited

U.S. PATENT DOCUMENTS

2020/0135546 A1*  4/2020  Wang .................. H01L 21/0338

* cited by examiner

Primary Examiner — Cuong B Nguyen
(74) Attorney, Agent, or Firm — JCIPRNET

(57) ABSTRACT

A semiconductor device and a method are provided. The semiconductor device includes gate structures extending on a substrate along a first direction and arranged in a second direction in parallel with one another, source and drain regions disposed in the substrate between the parallel gate structures, and dielectric structures disposed on the substrate and between the gate structures. The semiconductor device further includes an ILD layer disposed over the gate structures and the dielectric structures, contact structures disposed beside and between the parallel gate structures and separators embedded in the ILD layer. Each contact structure extends vertically through the ILD layer and the dielectric structures, and the separators are disposed above the gate structures and disposed beside the contact structures. Each contact structure extends along the first direction and extends between two adjacent separators, and each separator extending in the second direction overlaps at least two adjacent gate structures.

20 Claims, 22 Drawing Sheets

SEMICONDUCTOR DEVICE AND MANUFACTURING METHOD THEREOF

BACKGROUND

The semiconductor integrated circuit (IC) industry has experienced rapid growth recently. For example, IC technologies are frequently being improved by scaling down device geometries to achieve lower fabrication costs, higher device integration density, higher speeds, and better performance. However, such scaling down has also been accompanied by increased complexity in design and manufacturing of devices incorporating these ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
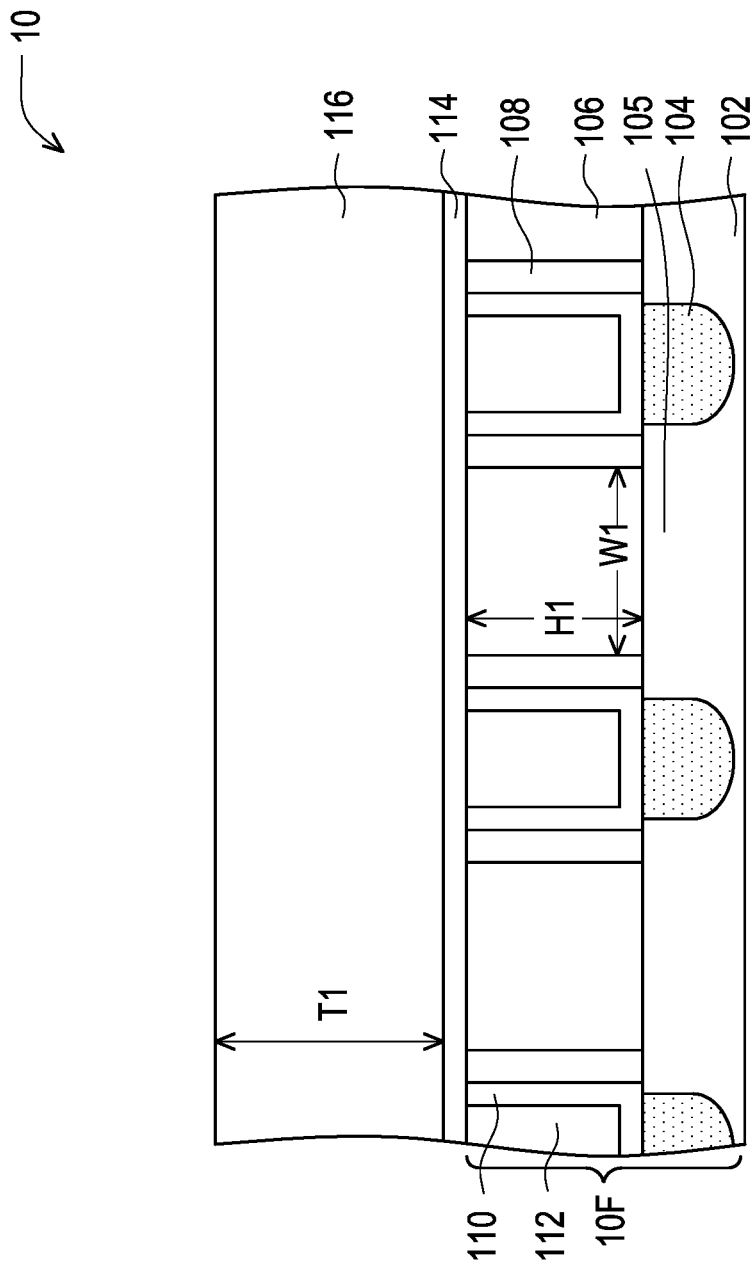
FIG. 1 through FIG. 16 are schematic cross-sectional views and exemplary layouts at various stages in the formation of contact structures of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description. Source/drain structure(s) may refer to a source or a drain, individually or collectively dependent upon the context.

A contact separator refers to an isolation feature that separates an elongated contact structure (e.g., contact slot) into multiple segments (e.g., contact slot segments). For example, an elongated source/drain contact may be separated by one or more source/drain contact separators into multiple segments, each of which is electrically connected to one or more of underlying source/drain features of semiconductor devices.

Recently, self-aligned contact structures have been introduced in an effort to avoid high-aspect-ratio etching and to reduce contact resistances. Examples for forming self-aligned contact structures includes forming hard mask structures embedded in the inter-layer dielectric (ILD) layer to selectively define the locations of the source/drain contact structure extending through the ILD layer. In such embodiments, the hard mask structures are generally formed of dielectric material such as silicon and act as source/drain contact separators. However, the etching resistance of the silicon hard mask structure may not high enough to survive the subsequent etching processes for forming contact slot openings (for example, the silicon hard mask may be etched through during the formation of the contact slot openings), resulting in incomplete or ineffective separation of the contact structures. Besides, another possible problem of the silicon hard mask structure is that short circuit may be occurred between the silicon residue (if have) and the final contact structures.

The present disclosure provides source/drain contact separators that exhibit high resistance to etching processes such as dry etching and wet etching, and a method for forming source/drain contact slot segments that are separated from one another with such source/drain contact separators. By using hard mask structures having high etching resistance (for example, including material such as metal oxide material or high-K material) as a source/drain contact separator, the risk of unwanted short circuit between the adjacent source/drain contact slot segments can be reduced.

The various aspects of the present disclosure will now be described in more detail with reference to the figures. FIG. 1 through FIG. 16 are schematic cross-sectional views and exemplary layouts at various stages in the formation of contact structures of a semiconductor device in accordance with some embodiments of the disclosure. It is understood that additional operations can be provided before, during, and after processes shown by FIG. 1 through FIG. 16, and some of the operations described below can be replaced or eliminated, for additional embodiments of the method. The order of the operations/processes may be interchangeable.

Referring to FIG. 1, a semiconductor device 10 is formed. In some embodiments, the semiconductor device 10 includes field-effect transistors (FET) such as planar FETs, fin FETs, nanosheet FETs (NSFETs), or the like. In one embodiment, the semiconductor device 10 includes NSFETs comprising nanosheet channel structures that extend in parallel from a first source/drain region to a second source/drain region. The nanosheet channel structures may be continuously surrounded by one or more gate electrode layers that form a gate electrode structure. In some embodiments, the NSFET may also be referred to, for example, a gate-all-around FET (GAA FET), a gate surrounding transistor, a multi-bridge channel (MBC) transistor, a nanowire FET, or the like.

As shown in FIG. 1, the semiconductor device 10 includes a substrate 102, source/drain regions 104 formed within the substrate 102, gate structures 106 disposed over the substrate 102 and gate spacers 108 disposed on sidewalls of the gate structure 106. The semiconductor device 10 further includes an insulating layer 110 that conformally covers the gate spacers 108 and top surface of the substrate 102 and dielectric structures 112 disposed between the adjacent gate structures 106. As illustrated in FIG. 1, top surfaces of the gate structures 106, the gate spacers 108, the insulating layer 110 and the dielectric structures 112 are substantially levelled with one another after a planarization process is performed. Furthermore, an insulating layer 114 is disposed on the top surfaces of the gate structures 106, the gate spacers 108, the insulating layer 110 and the dielectric structures 112.

In some embodiments, the substrate 102 is a semiconductor substrate such as a silicon substrate. The substrate 102 may include various doping configurations depending on design requirements as is known in the art. The substrate 102 may also include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Further, in some embodiments, the substrate 102 includes an epitaxial layer such that the substrate 102 is strained for performance enhancement. In some other embodiments, the substrate 102 includes a silicon-on-insulator (SOI) structure. Other substrates, such as multi-layered or gradient substrates, may also be used.

In some embodiments, the source/drain regions 104 are epitaxially formed within the substrate 102. Depending on the device types and design requirements, the source/drain regions 104 may be doped with n-type dopant or p-type dopant. As shown in FIG. 1, the gate structures 106 are disposed over channel regions 105 (e.g., regions between the adjacent source/drain regions 104 within the substrate 102), and each of the gate structures 106 includes a conductive material, for example, titanium, tantalum, aluminum, or some other suitable conductive material. In some embodiments, the gate structures 106 are formed as nanosheet gate structures. In an embodiment, a gate width W1 of each gate structure 106 may be about 18 nm, and a gate height H1 of each gate structure 106 may be about 18 nm. Further, in some embodiments, a pair of gate spacers 108 are located on opposite outer sidewalls of each gate structure 106, and the insulating layer 110 are located on outer sidewalls pf the gate spacers 108. In some embodiments, the gate spacers 108 include gate dielectric material such as silicon oxide, some other suitable oxide(s), or some other suitable dielectric(s).

In some embodiments, the insulating layer 110 and dielectric structures 112 are together used to provide better insulation between the gate structures 106. In some embodiments, the insulating layer 110 includes silicon nitride, or any suitable dielectric material. In some embodiments, the dielectric structures 112 include low-K dielectric materials. Exemplary low-K dielectric materials include porous silicon dioxide, carbon doped silicon dioxide, low-K silicon nitride, low-K silicon oxynitride, polyimide, spin-on glass (SOG), fluoride-doped silicate glass (FSG), phosphosilicate glass (PSG), borophosphosilicate glass (BPSG), Xerogel, Aerogel, amorphous fluorinated carbon, Parylene, bis-benzocyclobutenes (BCB), other suitable low-K dielectric materials, and/or combinations thereof. Further, in the disclosure, the substrate 102, the source/drain regions 104, the gate structures 106, the gate spacers 108, the insulating layer 110, the dielectric structures 112 are fabricated through the front-end-of-line (FEOL) manufacturing processes, and may be collectively referred to as a FEOL portion 10F of the semiconductor device 10.

Still referring to FIG. 1, after forming the insulating layer 114 over the FEOL portion 10F of the semiconductor device 10, a first inter-layer dielectric (ILD) layer 116 is formed on the insulating layer 114. In some embodiments, an insulation material for the insulating layer 114 may be the same as that or may be different from that for the insulating layer 110. In an embodiment, a thickness of the insulating layer 114 may be about 3 nm. In some embodiments, a material of the first ILD layer 116 includes one or more of low-K materials that is similar to those of the dielectric structures 112. The ILD layer 116 is formed by a suitable technique, such as chemical vapor deposition (CVD). For example, a high density plasma CVD (HDP CVD) may be implemented to form the ILD layer 116. In an embodiment, the first ILD layer 116 is formed with a thickness T1 of about 70 nm.

Figure 2:
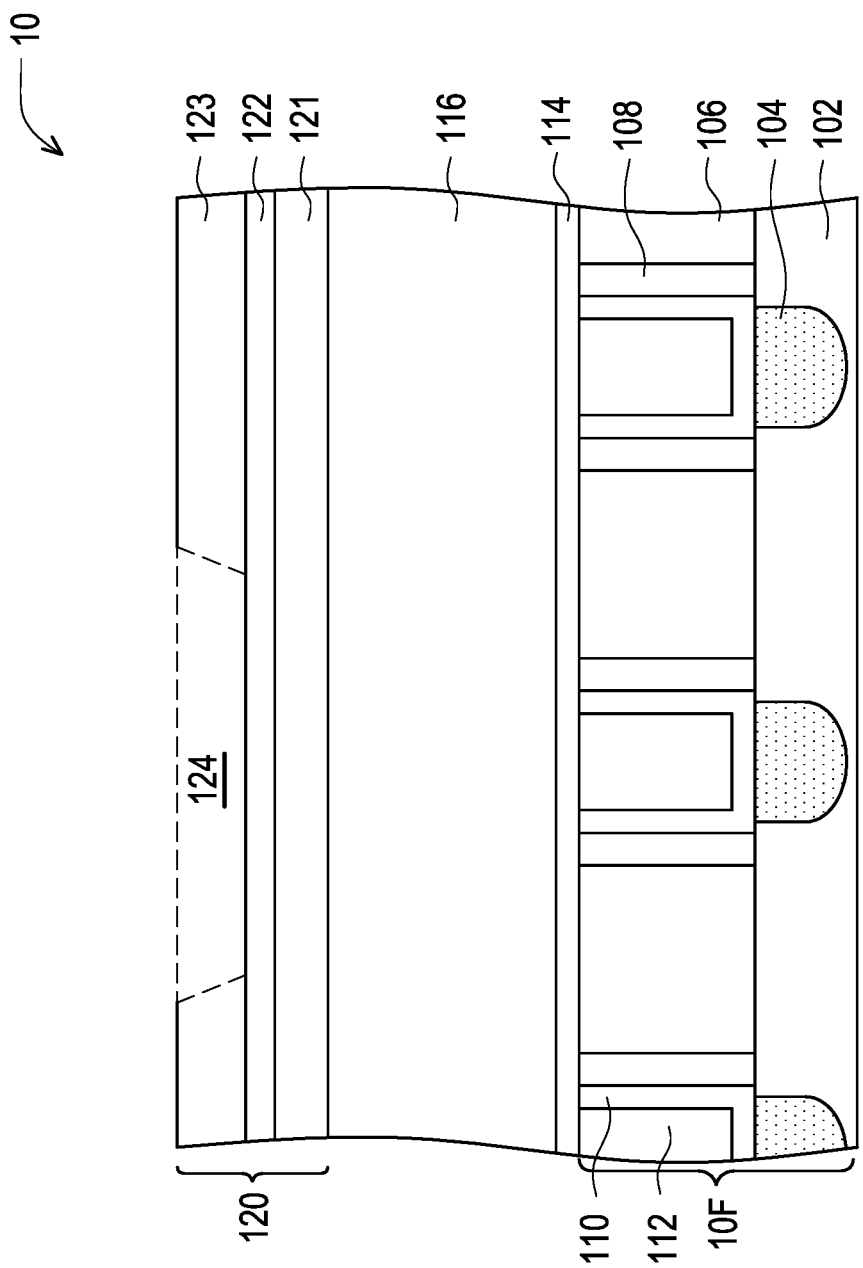

Referring to FIG. 2, a first tri-layer photoresist 120 is formed over the first ILD layer 116. In some embodiments, the first tri-layer photoresist 120 includes multiple masking layers that are blanketly deposited sequentially using, for example, spin-on processes. In some other embodiments, one or more of the masking layers are deposited using a process such as CVD, atomic layer deposition (ALD), any suitable deposition processes, or a combination thereof.

As illustrated in FIG. 2, the first tri-layer photoresist 120 includes a bottom layer 121 that is formed over the ILD layer 116. In some embodiments, the bottom layer 121 is formed of a polymer-based material. In an embodiment, the bottom layer 121 is a bottom anti-reflective coating (BARC) layer. For example, the bottom layer 121 may be formed from a material comprising $C_xH_yO_z$, using a spin-on process. The first tri-layer photoresist 120 further comprises a middle layer 122 that is formed over the bottom layer 121. In some embodiments, the middle layer 122 is formed from a material such as $Si_xH_yC_zO_w$, silicon, or a metal oxide using one or more deposition processes such as, spin-on, CVD and ALD. In some embodiments, a material composition of the middle layer 122 is determined to provide a high etching selectivity with respect to the underlying layers such as the bottom layer 121 and/or the ILD layer 116. The middle layer 122 may include more than one layer and may include more than one material. The first tri-layer photoresist 120 further includes a photoresist layer 123 over the middle layer 122. In some embodiments, the photoresist layer 123 is formed of a photoresist (e.g., a photosensitive material), which includes organic materials, and may be a positive photosensitive material or a negative photosensitive material. The photoresist layer 123 may be formed using one or more deposition processes such as a spin-on process, or the like.

In some embodiments, the latent pattern of the photoresist layer 123 (e.g., following exposure) is further shown in FIG. 2. Once deposited, the photoresist layer 123 may be exposed to form latent pattern that will later be developed and patterned to form an opening in the photoresist layer 123. In some embodiments, the opening pattern 124 is formed at a location right above a location that a hard mask structure will be later formed. Although only one opening pattern 124 is shown in FIG. 2, it is understood that the photoresist layer 123 may be patterned to include multiple opening patterns 124. As illustrated in FIG. 2, the opening pattern 124 is formed to have opposite tapered sidewalls. However, the sidewalls of the opening pattern 124 may be substantially straight upright sidewalls, according to some embodiments.

Figure 3:
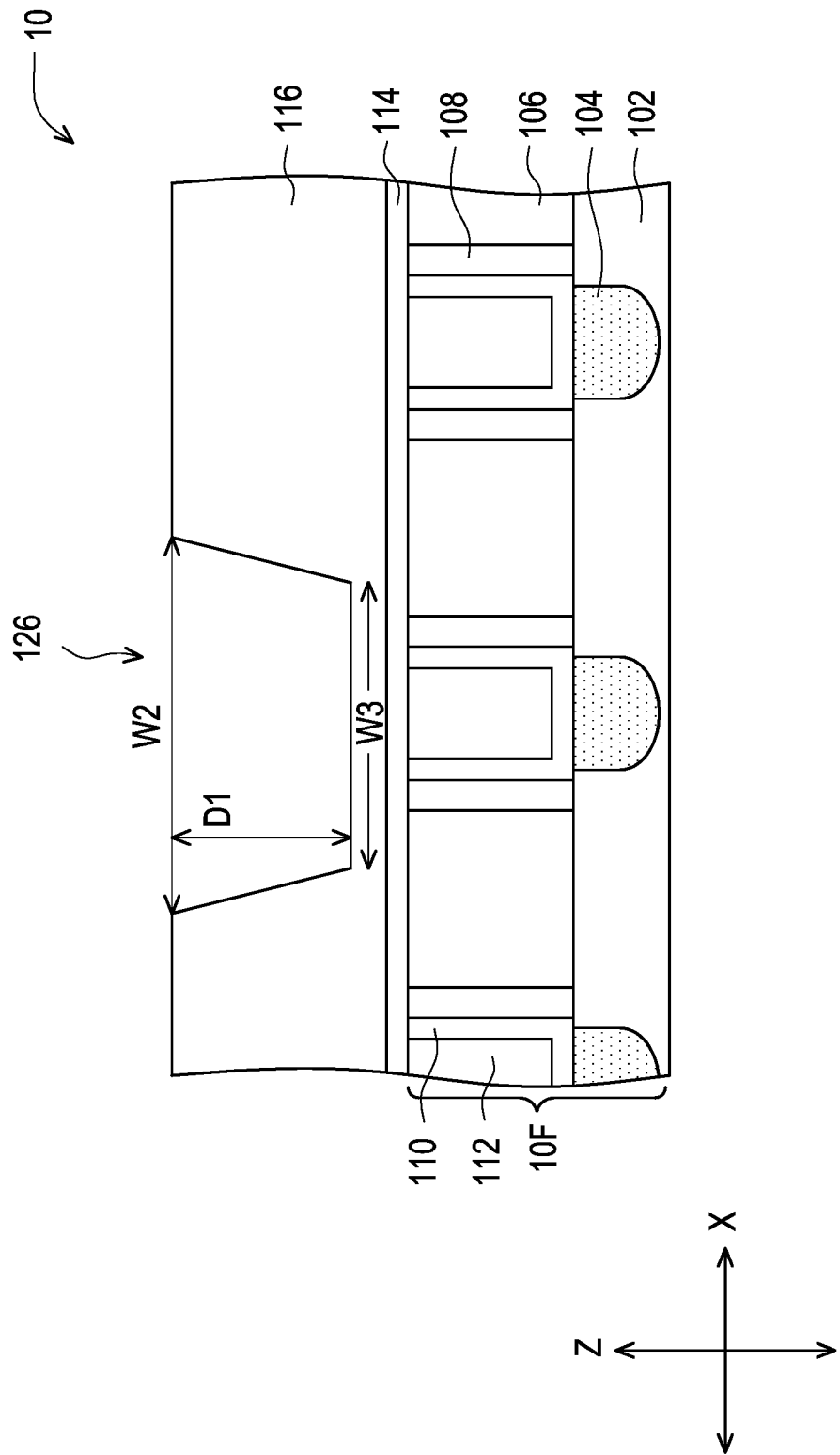
Figure 4:
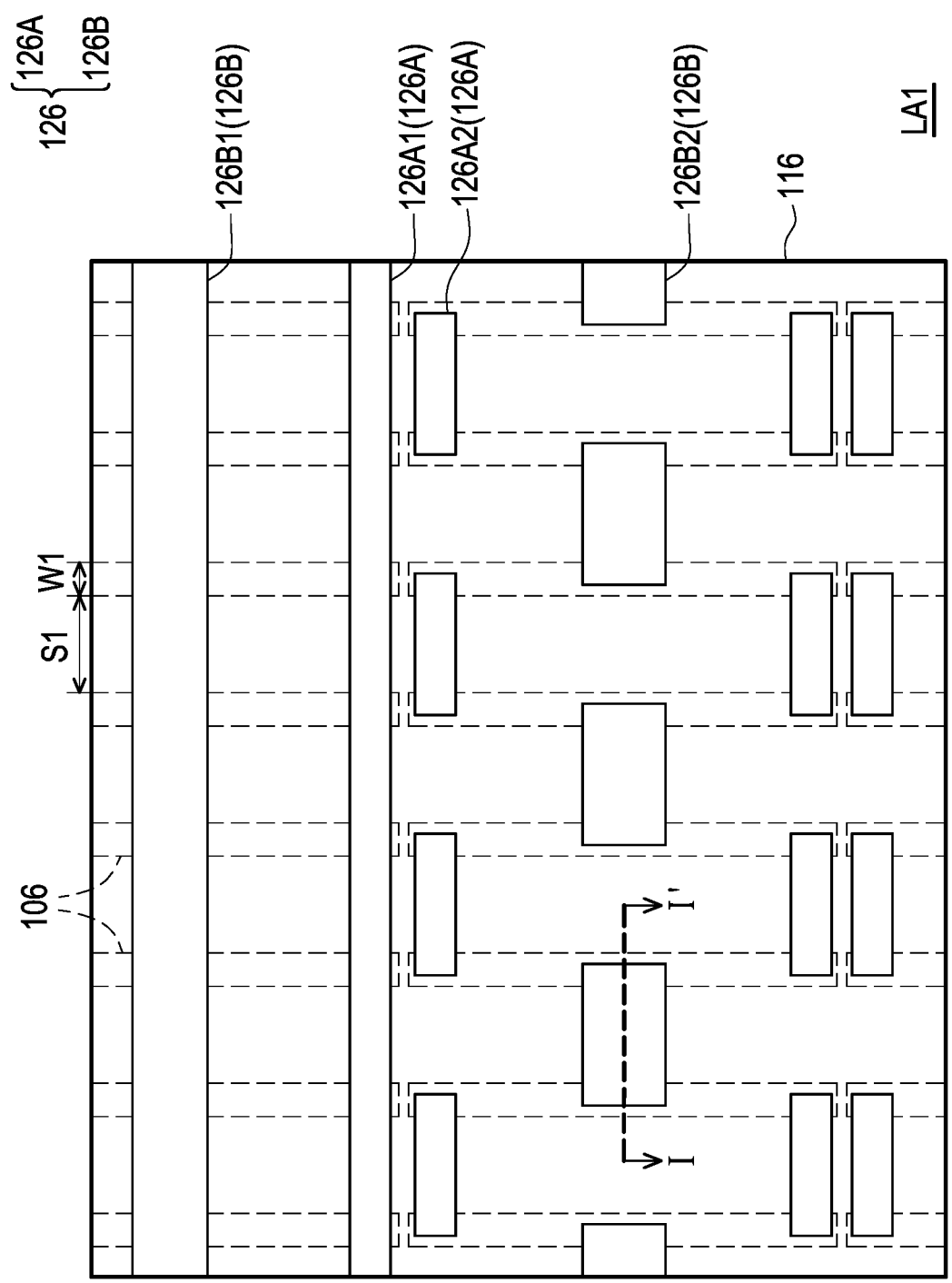

Referring to FIG. 3 and FIG. 4 together, the exemplary top view of FIG. 4 illustrates the relative layout of the devices, and the cross-sectional view of FIG. 3 is taken along the cross-section line I-I' shown in FIG. 4. The schematic top view of the first layout LA1 of FIG. 4 only shows the arrangements of gate structures 106, the ILD layer 116 and the openings 126 for illustration purposes, and some elements may be omitted for simplicity and clarity. It is understood that the first layout LA1 shown in FIG. 4 is merely an exemplary layout and may be changed based on the design requirements.

Referring to FIG. 3, the opening pattern 124 (see FIG. 2) in the photoresist layer 123 is transferred to the middle layer 122 and the bottom layer 121 of the first tri-layer photoresist 120 and further into the ILD layer 116 so as to form an opening 126 in the ILD layer 116. The pattern transfer may be achieved using any suitable etching process including wet etching, dry etching, reactive ion etching (RIE), and/or other suitable techniques. Thereafter, the first tri-layer photoresist 120 may be removed using, for example, a stripping process (e.g. a wet strip process) or an ashing process (e.g. plasma ashing process). As shown in FIG. 3, the opening 126 is formed into the ILD layer 116 with a depth D1 without exposing the insulating layer 114 underlying the ILD layer 116. That is, the opening 126 does not penetrate through the ILD layer 116, and is formed with a depth smaller than the thickness of the ILD layer 116. In some embodiments, the depth D1 of the opening 126 is larger than about 50 nm. In the illustrated embodiment, the opening 126 includes tapered sidewalls. In other words, a top width W2 of the opening 126 is larger than a bottom width W3 of the opening 126.

As shown in FIG. 4, below the ILD layer 116, a plurality of strip-shaped gate structures 106 is formed. As seen in FIG. 4, the separate strip-shaped gate structures 106 are arranged as columns extending along the Y-direction, and the columns of the gate structures 106 are arranged in parallel with each other. In some embodiments, two adjacent columns of the gate structures 106 are spaced apart from each other by a spacing S1. In an embodiment, the spacing S1 is in a range of between about 20 nm to about 22 nm.

In addition, as seen from FIG. 3 and FIG. 4, the openings 126 are formed in the ILD layer 116 above the FEOL portion 10F. Depending on the layout design, the openings 126 may be formed to have various sizes and top-view shapes such as block shapes, strip shapes or a combination thereof (as seen from first layout LA1). For example, the openings 126 may include openings 126A arranged at locations above and near line-ends of the strip-shaped gate structures 106 and openings 126B arranged at locations above and across the gate structures 106 (e.g., the openings 126B are arranged at locations above and near the middle of the gate structures 106). In some embodiments, the openings 126A include one strip-shaped opening 126A1 and block-shaped openings 126A2. Further, in some embodiments, the strip-shaped opening 126A1 extends across line-end portions of multiple gate structures 106 along the X-direction, and the location of the strip-shaped opening 126A1 is vertically overlapped with the locations of the line-end portions of multiple gate structures 106 (i.e. the orthogonal projection of the strip-shaped opening 126A1 is overlapped with line-end portions of multiple gate structures 106). In some embodiments, each opening block-shaped 126A2 extends between at least two gate structures 106, and the location of the block-shaped 126A2 is vertically overlapped with the locations of the line-end portions of at least two adjacent gate structures 106 (i.e. the orthogonal projection of the block-shaped opening 126A2 is overlapped with line-end portions of two adjacent gate structures 106).

As seen in FIG. 4, in some embodiments, the openings 126B include one strip-shaped opening 126B1 and block-shaped openings 126B2. In some embodiments, the strip-shaped opening 126B1 extends across middle portions of multiple gate structures 106 along the X-direction, and the location of the strip-shaped opening 126B1 is vertically overlapped with the locations of the middle portions of multiple gate structures 106 (i.e. the orthogonal projection of the strip-shaped opening 126B1 is overlapped with middle portions of multiple gate structures 106). In some embodiments, the block-shaped opening 126B2 is arranged at the location partially overlapping at least two adjacent gate structures 106 (i.e. the orthogonal projection of the opening 126B2 is overlapped with the middle portions of two adjacent gate structures 106). It is noted that the openings 126 in the figures are illustrated to include square corners from a top view; however, the openings 126 may include rounded corners within processing variation.

Figure 5:
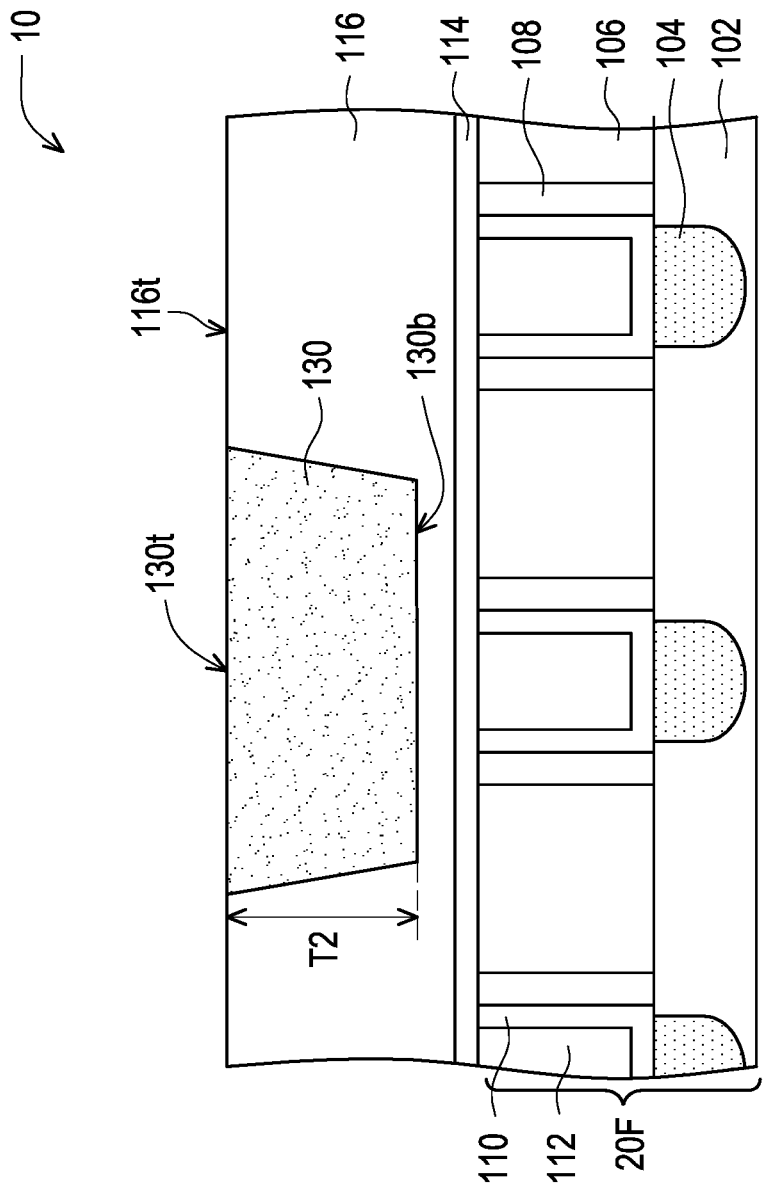

Referring to FIG. 5, the openings 126 (only one is shown) are filled with a hard mask material, and a hard mask structure 130 is formed in the opening 126. In some embodiments, the hard mask material has a relatively high etch selectivity with respect to the material of the ILD layer 116 such that the underlying ILD layer is protected from subsequent etching process. For example, the hard mask material of the hard mask structure 130 may include metal oxides such as aluminum oxide (e.g. $Al_2O_3$), lanthanum oxide (e.g. $La_2O_3$), niobium pentoxide ($Nb_2O_5$), titanium dioxide ($TiO_2$), tantalum oxide (e.g. $Ta_2O_3$), titanium nitride (TiN), hafnium dioxide ($HfO_2$), zirconium dioxide ($ZrO_2$), tungsten trioxide ($WO_3$), magnesium oxide (MgO), and other high-K materials. In some embodiments, the hard mask material is deposited through a suitable deposition process such as CVD or ALD to fill up the opening 126.

In some embodiments, the deposition of the hard mask material further covers a surface 116t of the ILD layer 116. In embodiments where the hard mask material covers the ILD layer 116, a planarization process (e.g., a chemical mechanical polish (CMP) process, an etching back process, or a grinding process) is performed to remove the excess hard mask material until the top surface 116t is exposed such that the hard mask structure 130 is formed. In such embodiments, a top surface 130t of the hard mask structure 130 is coplanar to and levelled with the top surface 116t of the ILD layer 116. As shown in FIG. 5, a width of a bottom surface 130b is less than a width of the top surface 130t. In some embodiments, a thickness T2 of the hard mask structure 130 is the same as the depth D1 of the opening 126. In other words, the thickness of the hard mask structure 130 accounts for more than about 71.4% of the thickness of the ILD layer 116.

Figure 6:
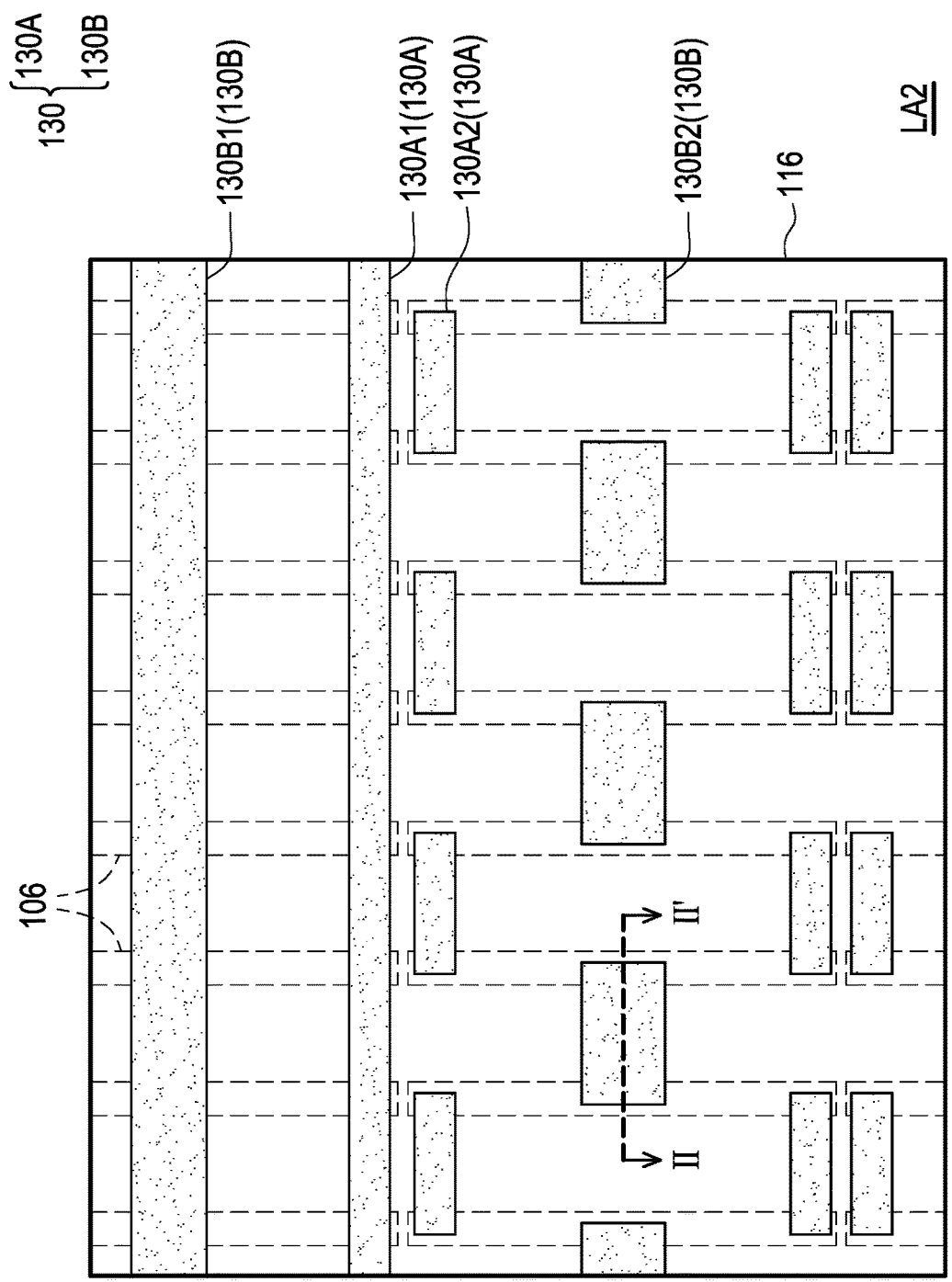

A second layout LA2 that is similar to the first top view layout LA1 is shown in FIG. 6. The difference between the first layout LA1 and the second layout LA2 is that the hard mask structures 130 are formed at the locations where the openings 126 are arranged. That is, an arrangement of the hard mask structures 130 is the same as the arrangement of the openings 126 since the hard mask structures 130 are formed by filling up the openings 126 with hard mask material. For example, the hard mask structures 130 include hard mask structures 130A arranged at locations above and near line-ends of the strip-shaped gate structures 106 and hard mask structures 130B arranged at locations above and across the gate structures 106. Further, the hard mask structures 130A and the hard mask structures 130B respectively include strip top-view shapes (i.e., hard mask structures 130A1, 130B1) and block top-view shapes (i.e., hard mask structures 130A2, 130B2).

Figure 7:
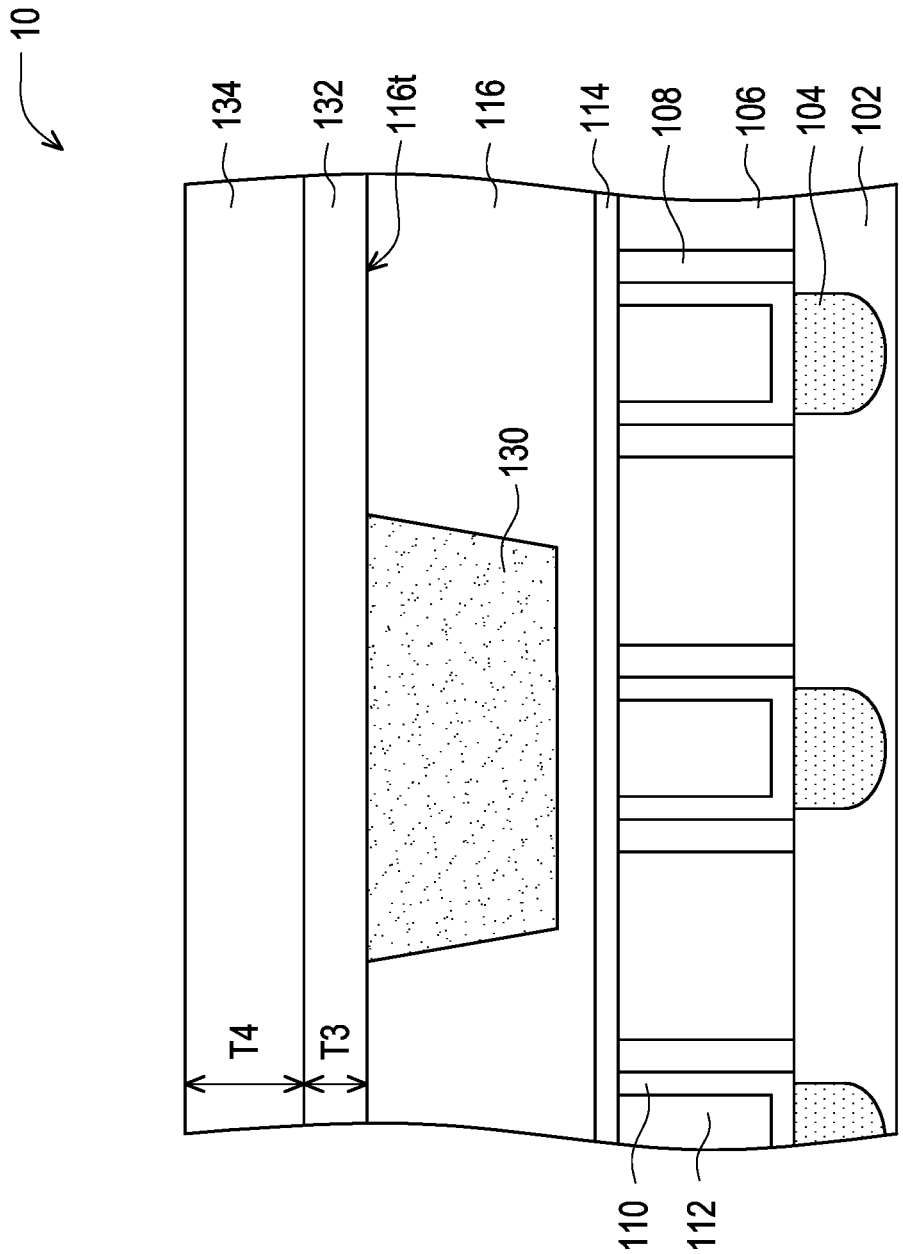

Turing to FIG. 7, a barrier layer 132 and a dielectric layer 134 are sequentially deposited over the structure shown in FIG. 5. For example, the barrier layer 132 is formed on the top surface 130t of the hard mask structure 130 and the top surface 116t of the ILD layer 116, and the dielectric layer 134 is then formed on the barrier layer 132. In some embodiments, the barrier layer 132 is formed of tungsten carbide (WC) through a suitable deposition process such as CVD. In some embodiments, the dielectric layer 134 is formed of a dielectric material such as silicon oxide through a suitable deposition process such as CVD or physical vapor deposition (PVD). In an embodiment, the barrier layer 132 is formed with a thickness T3 that is about 18 nm, and the dielectric layer 134 is formed with a thickness T4 that is about 40 nm.

Figure 8:
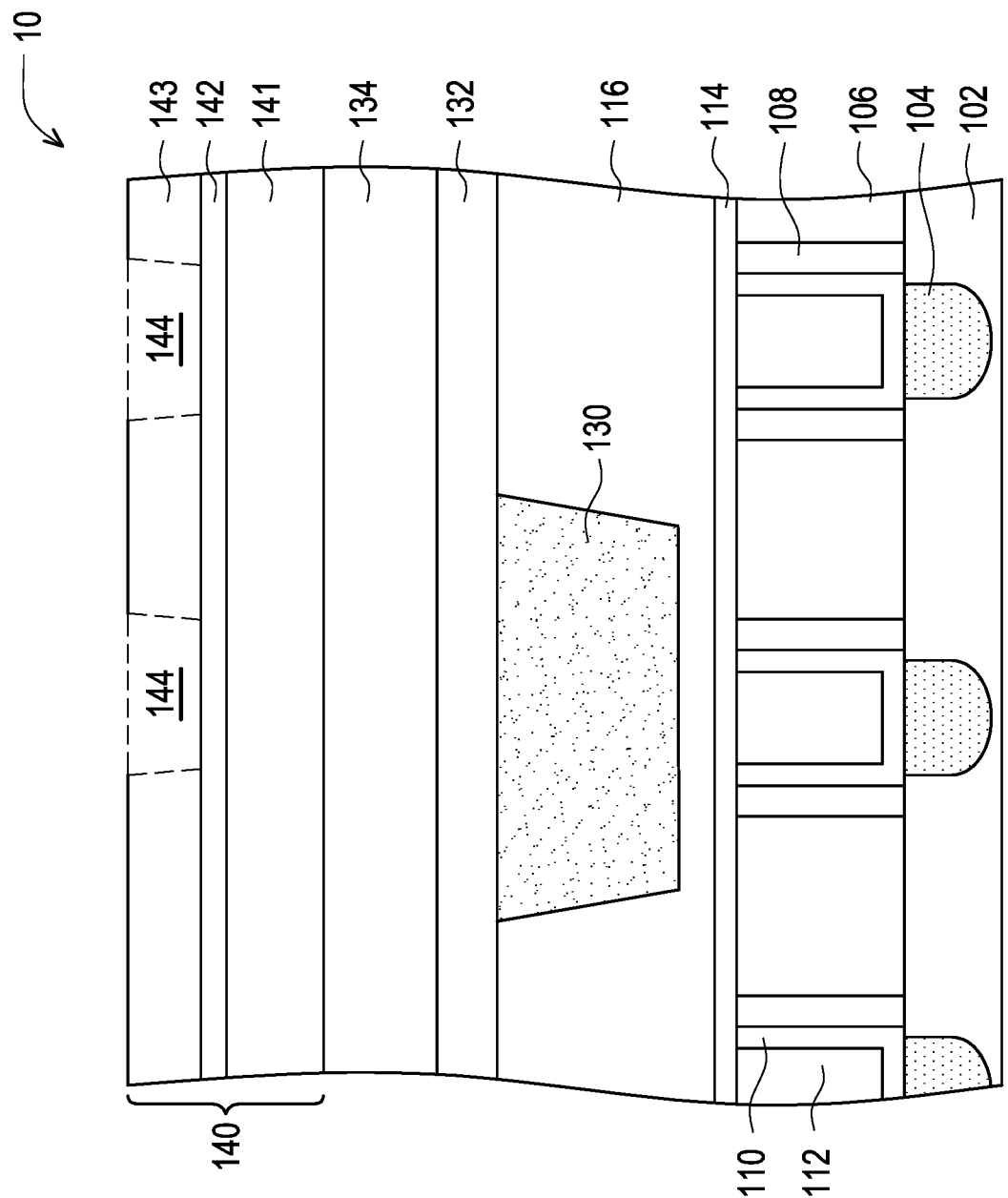

Referring to FIG. 8, a second tri-layer photoresist 140 is formed over the dielectric layer 134. The second tri-layer photoresist 140 may be similar to the first tri-layer photoresist 120 and include a bottom layer 141, a middle layer 142, and a photoresist layer 143. The materials and forming methods of the bottom layer 141, the middle layer 142, and the photoresist layer 143 are similar to those of the bottom layer 121, the middle layer 122, and the photoresist layer 123, thus will not be repeated herein.

Further, as shown in FIG. 8, a plurality of opening patterns 144 are formed in the photoresist layer 143 using a patterning process. In some embodiments, the opening patterns 144 are formed at locations right above locations that contact structures will be formed later. Although only two opening patterns 144 are shown in FIG. 8, it is understood that the photoresist layer 143 may be patterned to include more than two opening patterns 144. Further, as illustrated in FIG. 8, the opening patterns 144 are formed to include tapered sidewalls. However, the sidewalls of the opening patterns 144 may be substantially straight upright sidewalls, according to some embodiments.

Figure 9:
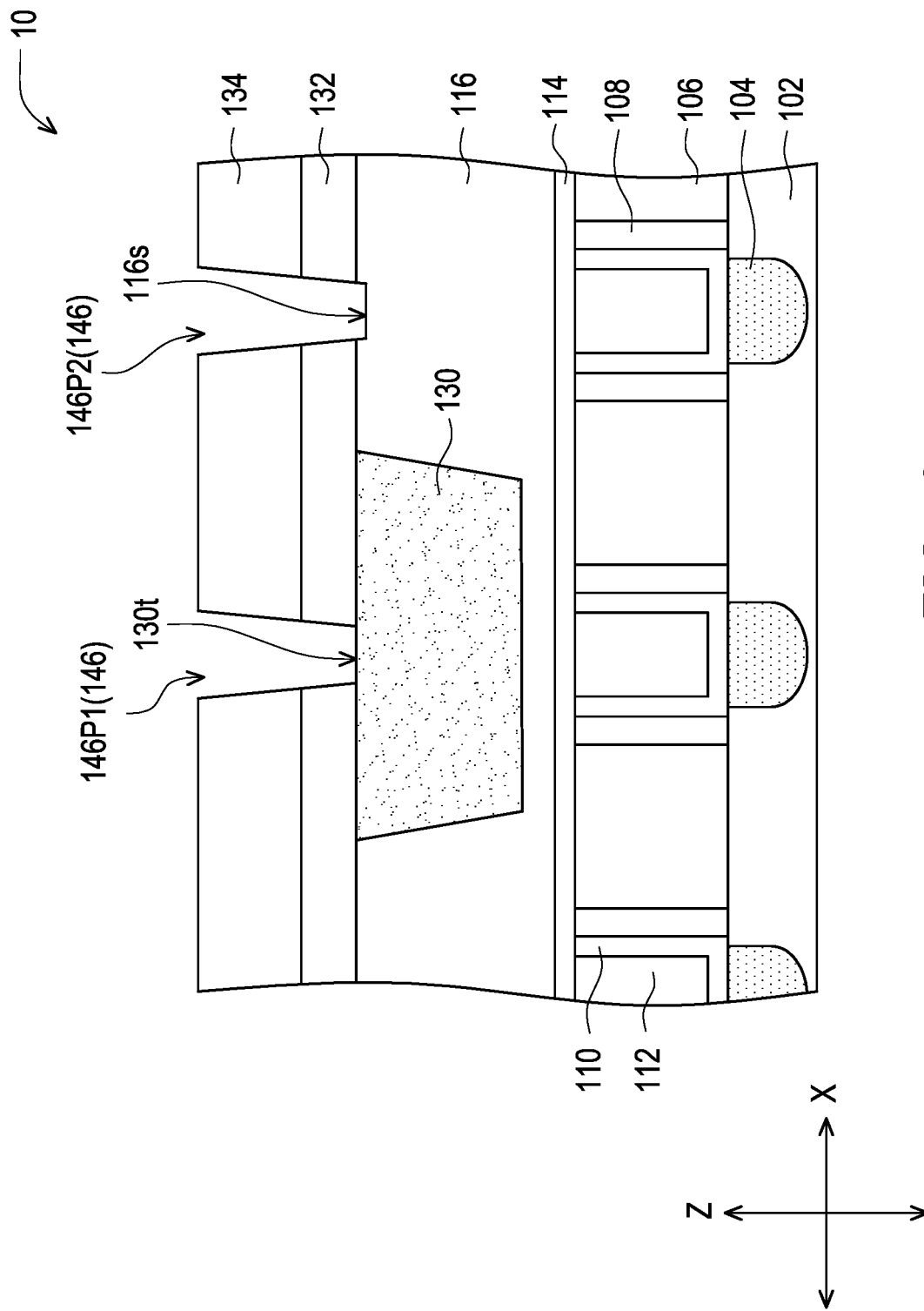
Figure 10:
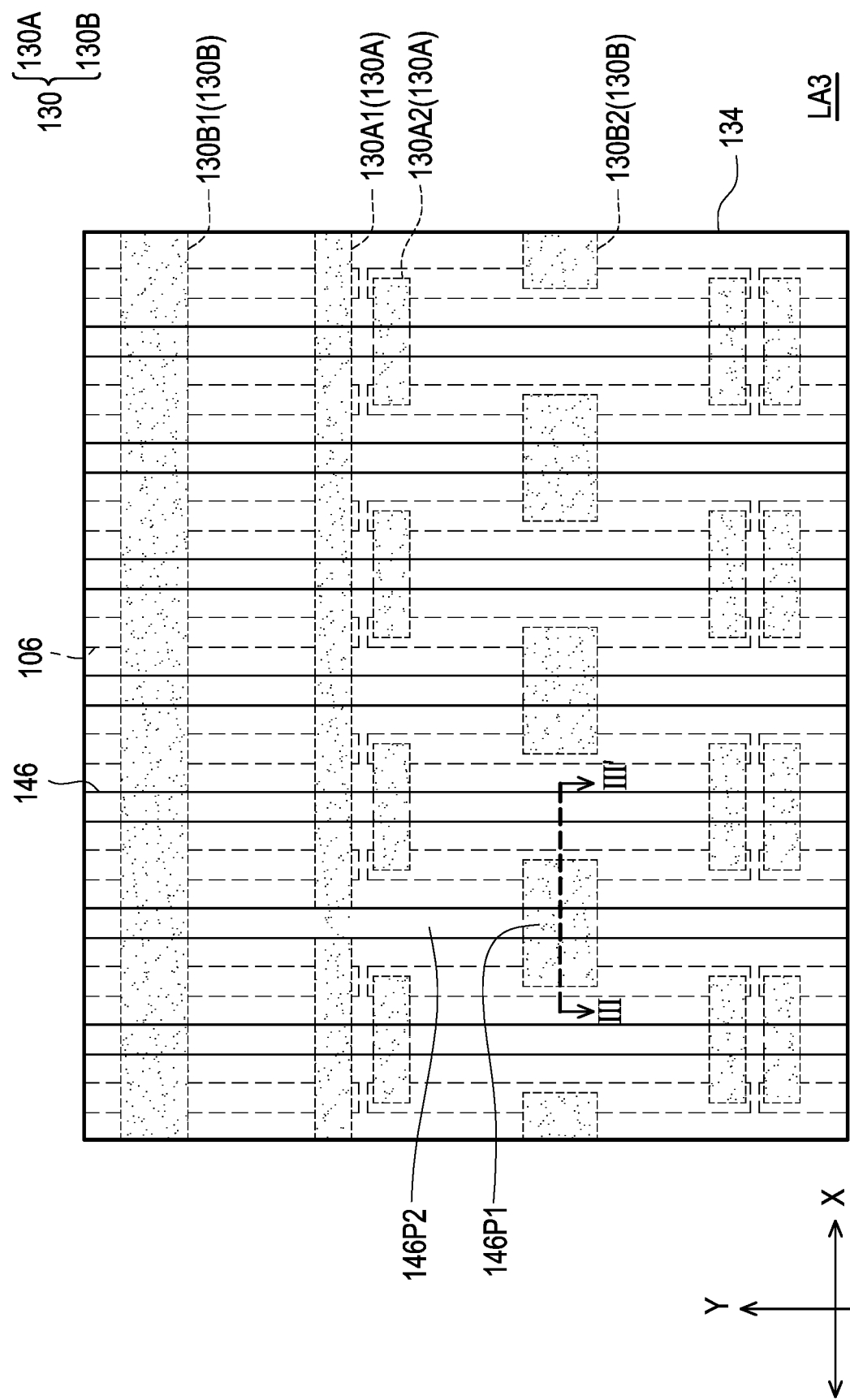

Referring to FIG. 9 and FIG. 10 together, the exemplary top view of FIG. 10 illustrates the relative layout of the devices, and the cross-sectional view of FIG. 9 is taken along the cross-section line III-III' shown in FIG. 10. The third layout LA3 of FIG. 10 only shows arrangements of gate structures 106, the ILD layer 116, the hard mask structures 130, the dielectric layer 134, and openings 146 for illustration purposes, and some elements may be omitted for simplicity and clarity. It is understood that the third layout LA3 shown in FIG. 10 is merely an exemplary layout and may be changed based on the design requirements.

Referring to FIG. 9, the opening patterns 144 (see FIG. 8) in the photoresist layer 143 is transferred to the middle layer 142 and the bottom layer 141 of the second tri-layer photoresist 140 and further penetrates through the dielectric layer 134 and the barrier layer 132 to form openings 146. The transfer may be achieved using one or more suitable etching processes including wet etching, dry etching, RIE, and/or other suitable techniques. In an embodiment, the etching process includes a dry etching process that includes an etching gas of $Cl_2$, $NF_3$, or a combination thereof. The second tri-layer photoresist 140 may be removed using a stripping process such as a wet strip process or an ashing process such as plasma ashing process.

As shown in FIG. 10, the openings 146 are formed into multiple slot openings (e.g., line openings). For example, the line openings 146 are arranged extending along the Y-direction, and each slot opening 146 is arranged in parallel with each other and further located between two adjacent gate structures 106. Depending on the layout design, each opening 146 (i.e., slot opening) may include first opening portions 146P1 that extend above the hard mask structures 130 (i.e., the first opening portions 146P1 expose the hard mask structures 130) and second opening portions 146P2 that do not extend above the hard mask structures 130 (i.e., the second opening portions 146P2 expose the ILD layer 116). For example, FIG. 9 shows the respective first opening portion 146P1 and the respective second opening portion 146P2 of two slot openings 146 arranged in parallel. Owing to the difference in etch selectivity; the etching process for forming the slot openings 146 may etch the dielectric layer 134, the barrier layer 132 and a portion of the ILD layer 116, without etching the hard mask structure 130. As such, the top surface 130t of the hard mask structure 130 is exposed by the first opening portion 146P1, and a surface 116s of the ILD layer 116 is exposed by the second opening portion 146P2, as illustrated in FIG. 9. In some embodiments, the surface 116s of the ILD layer 116 is located at a level below the top surface 130t of the hard mask structure 130. In other words, the hard mask structure 130 may remain intact during the formation of the slot openings 146. In some embodiments, the slot openings 146 are formed with tapered sidewalls.

Figure 11:
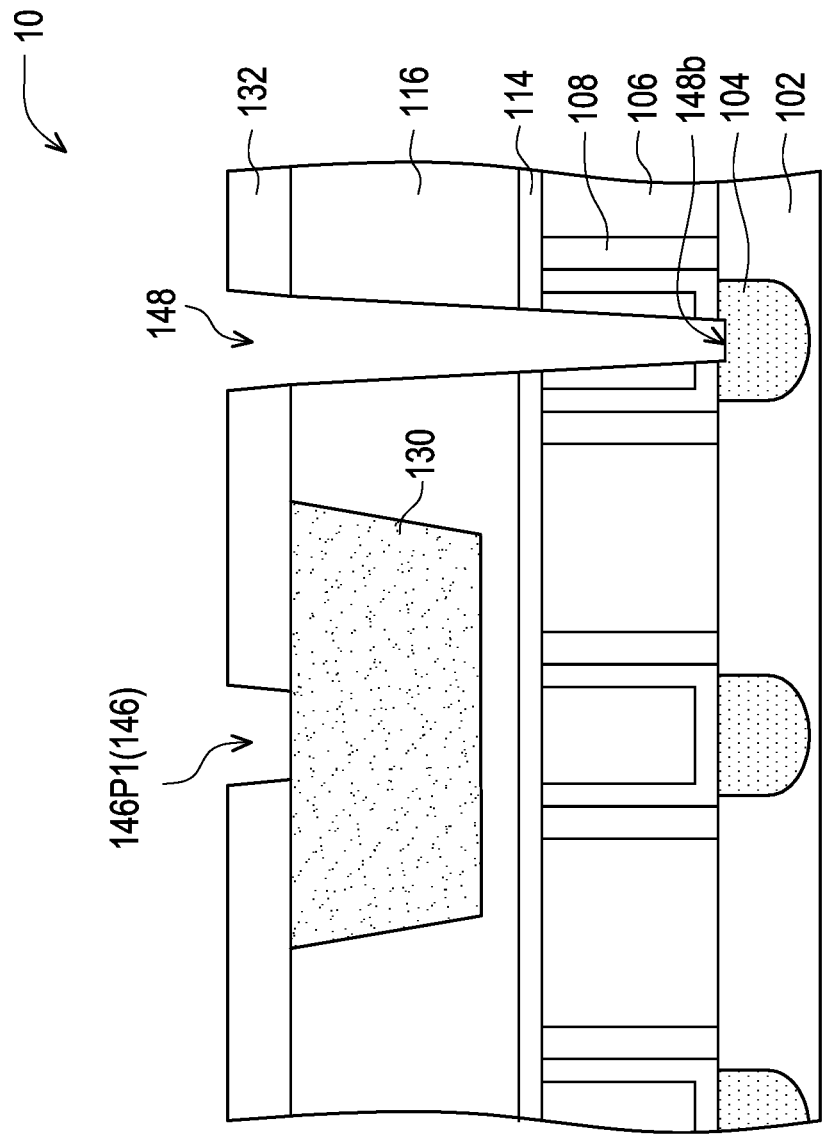

Referring to FIG. 11, one or more etching processes are performed to transfer patterns of the slot openings 146 to the underlying layers below the openings 146. For example, the second opening portion 146P2 may be transferred all the way down to the substrate 102, yet the hard mask structure 130 exposed by the first opening portion 146P1 remains intact during the etching processes. In some embodiments, the etching processes include, for example, a first etching process (e.g., a main etching process), a second etching process (e.g., a soft-landing process that stops on the insulating layer 114) and a third etching process (e.g., an over-etching process that etches through the insulating layer 114, the dielectric layer 112, and the insulating layer 110). The etching processes are performed to etch back portions of the ILD layer 116, the insulating layer 114, the dielectric structure 112, and the insulating layer 110 and down to the substrate 102.

In some embodiments, the first etching process includes, for example, a dry etching using an etching gas of $CF_4$, $H_2$, and $N_2$. In some embodiments the soft-landing etching is performed using a dry etch process with little or no bias power and low energy plasma or no plasma and stops when an etch stop condition is detected. When used with a slow etch process, the end point detection can stop the etching accurately and minimized plasma-induced damage to the underlying material. Further, an over-etching process may be provided to slightly recess the substrate 102 (e.g., the source/drain regions 104) and to further ensure the physical contact between the source/drain regions 104 and respective contact structures later formed. In some embodiments, the second and third etching processes each includes, for example, a dry etching using an etching gas of $C_4F_6$, $O_2$, CO.

After the above-mentioned etching processes, a through-hole 148 is formed exposing the source/drain regions 104. In some embodiments, a bottom surface 148b of the through-hole 148 is located below a top surface of the source/drain regions 104. That is, the through-hole 148 may extend into the source/drain regions 104. As shown in FIG. 11, the through-hole 148 may include tapered sidewalls.

Figure 12:
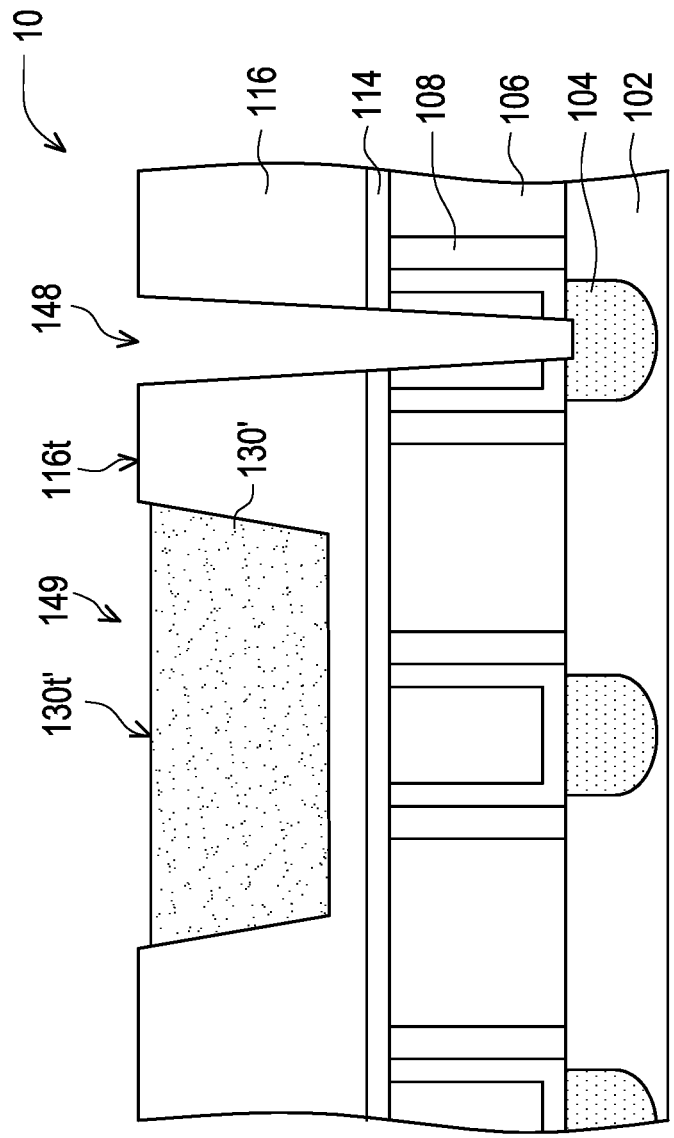

Referring to FIG. 12, the barrier layer 132 is removed using one or more suitable etching processes. In some embodiment, a dry etching process, followed by a wet clean etching process is performed to effectively remove the barrier layer 132. In an embodiment, the wet clean etching process includes using a mixture of hydrogen chloride (HCl), hydrogen peroxide ($H_2O_2$) and deionized water as an etching solution. Further, in some embodiments, the hard mask structure 130 may be slightly etched to form a recess 149 during the etching processes, such that a top surface 130t' of the etched hard mask structure 130' is located below the top surface 116t of the ILD layer 116.

Figure 13:
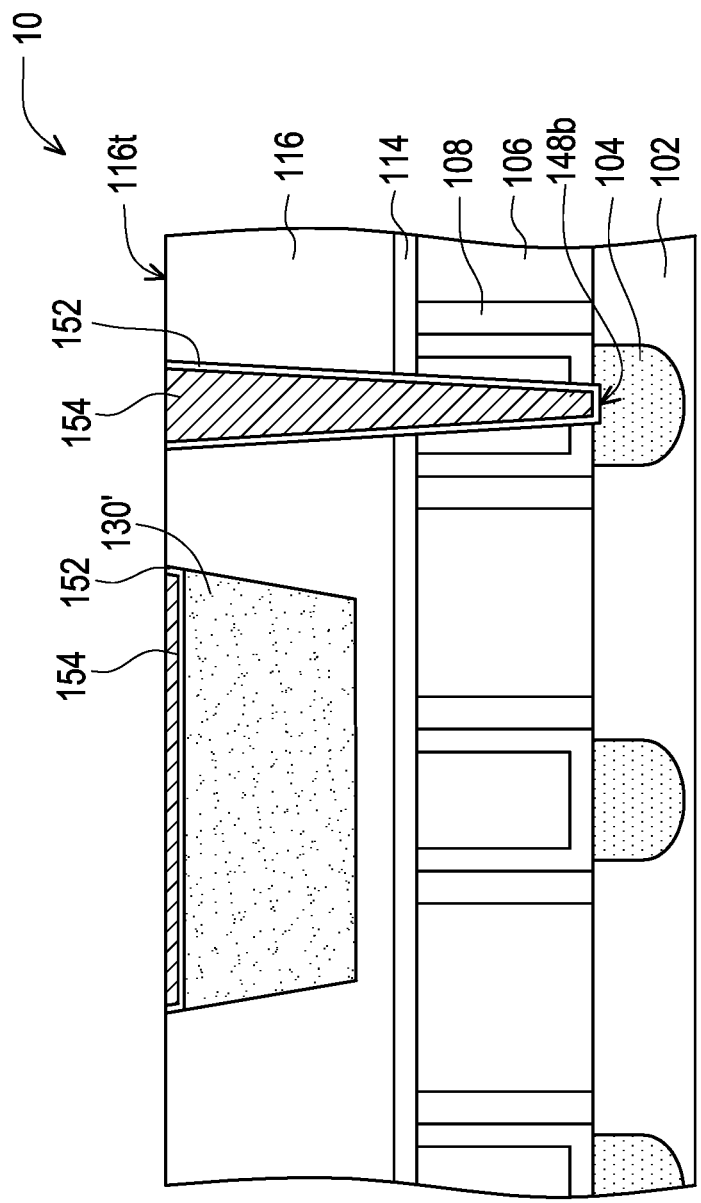

Referring to FIG. 13, adhesive layers 152 and conductive layers 154 are filled in the through-hole 148 and the recess 149. Prior to the formation of the adhesive layers 152 and the conductive layers 154, a pre-clean process may be performed to provide a clean surface of the through-hole 148 for subsequent deposition of the conductive material. In an embodiment, the pre-clean may be a chemical etch process in which the exposed surfaces are exposed to an etchant using either a plasma or non-plasma process. The etchant may include, for example, a nitrogen or fluorine containing etchant, such as NF 3 or HF, although any suitable etchant may alternatively be utilized.

Thereafter, a blanket layer of the adhesive (glue) material is formed using deposition process such as CVD, PVD, ALD, sputtering, electro-plating, or a combination thereof. In some embodiments, the adhesive material includes Ti or TiN. A conductive material is then formed on the adhesive material and filled up the through-hole 148 and the recess 149. The conductive material may be formed by CVD, PVD, ALD, electro-plating, or a combination thereof. In some embodiments, the conductive material includes metallic material such as Co, W, Mo, or Cu. In some other embodiments, a silicide region (not shown) is formed at the bottom surface 148b of the through-hole 148 (i.e., an interface between the adhesive material and the source/drain structure 104). The silicide region may be formed using, for example, an annealing process to diffuse the adhesive material into an upper portion of the source/drain structure 104. In embodiments where the adhesive material includes Ti, the silicide region includes $TiSi_x$. Such diffusion may increase the conductivity of affected areas of the source/drain structure 104.

Subsequent to the deposition of the adhesive material and the conductive material and the optional annealing process, a planarization process such as CMP or grinding process is performed to remove excess adhesive material and conductive material from the top surface 116t of the ILD layer.

Figure 14:
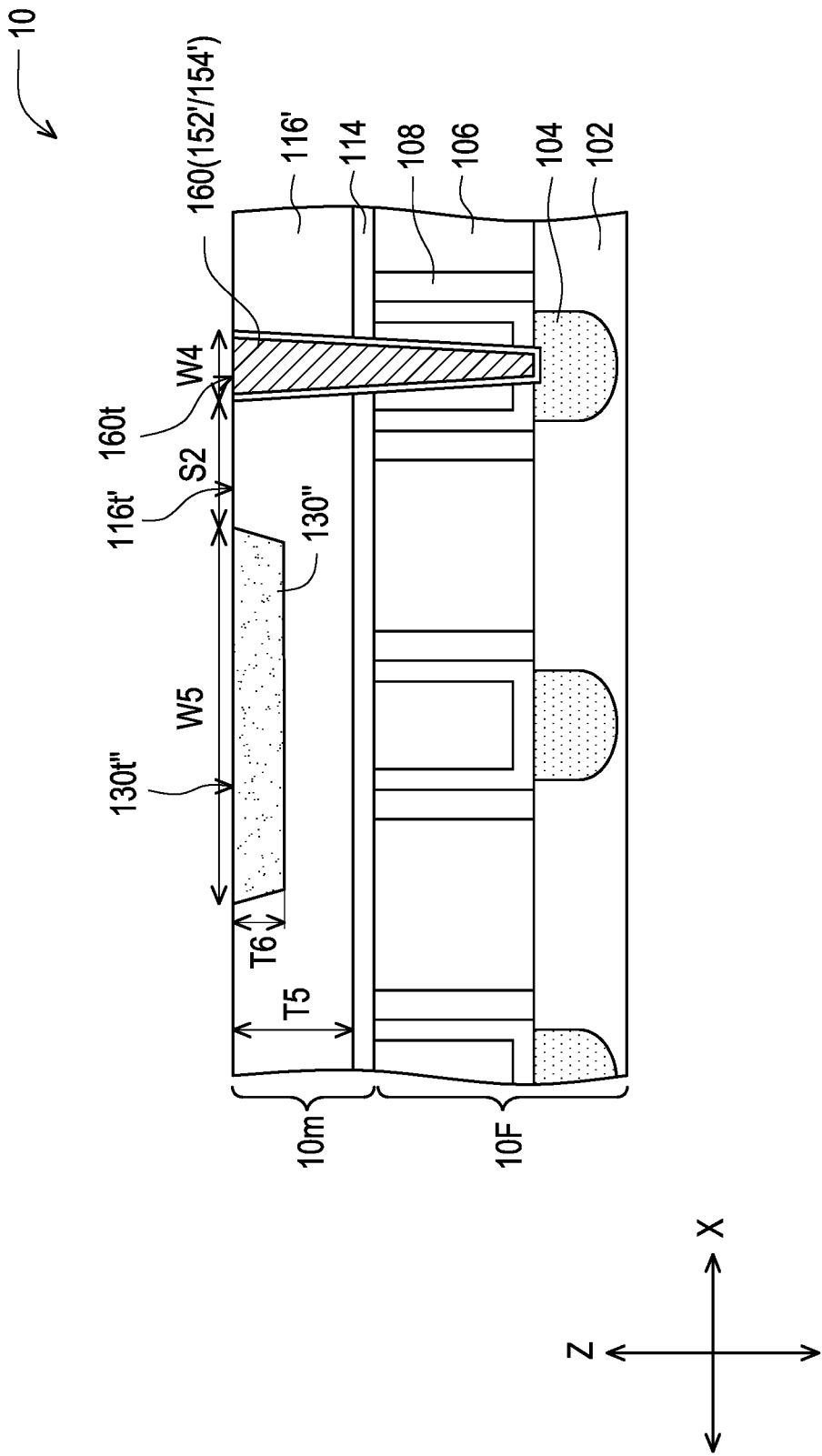

Referring to FIG. 14, a planarization process is performed to thin down the ILD layer 116 to a desired thickness. In some embodiments, the planarization process includes CMP or grinding process. After performing the planarization process, a thickness T5 of the remaining ILD layer 116' is about 18 nm, and a thickness T6 of a remaining hard mask structure 130" embedded in the remaining ILD layer 116' is less than about 10 nm. In other words, the thickness of the remaining hard mask structure 130" accounts for less than about 55.6% of the thickness of the remaining ILD layer 116'. Further, the remaining adhesive layer 152' and the remaining conductive layer 154' collectively form a contact structure 160. The contact structure 160 may also be referred to a contact plug that extends through the remaining ILD layer 116', the insulating layer 114, the dielectric structure 112 and the insulating layer 110. As illustrated in FIG. 14, a top surface 116t' of the remaining ILD layer 116 is coplanar to and levelled with a top surface 160t of the contact structure 160.

Figure 15:
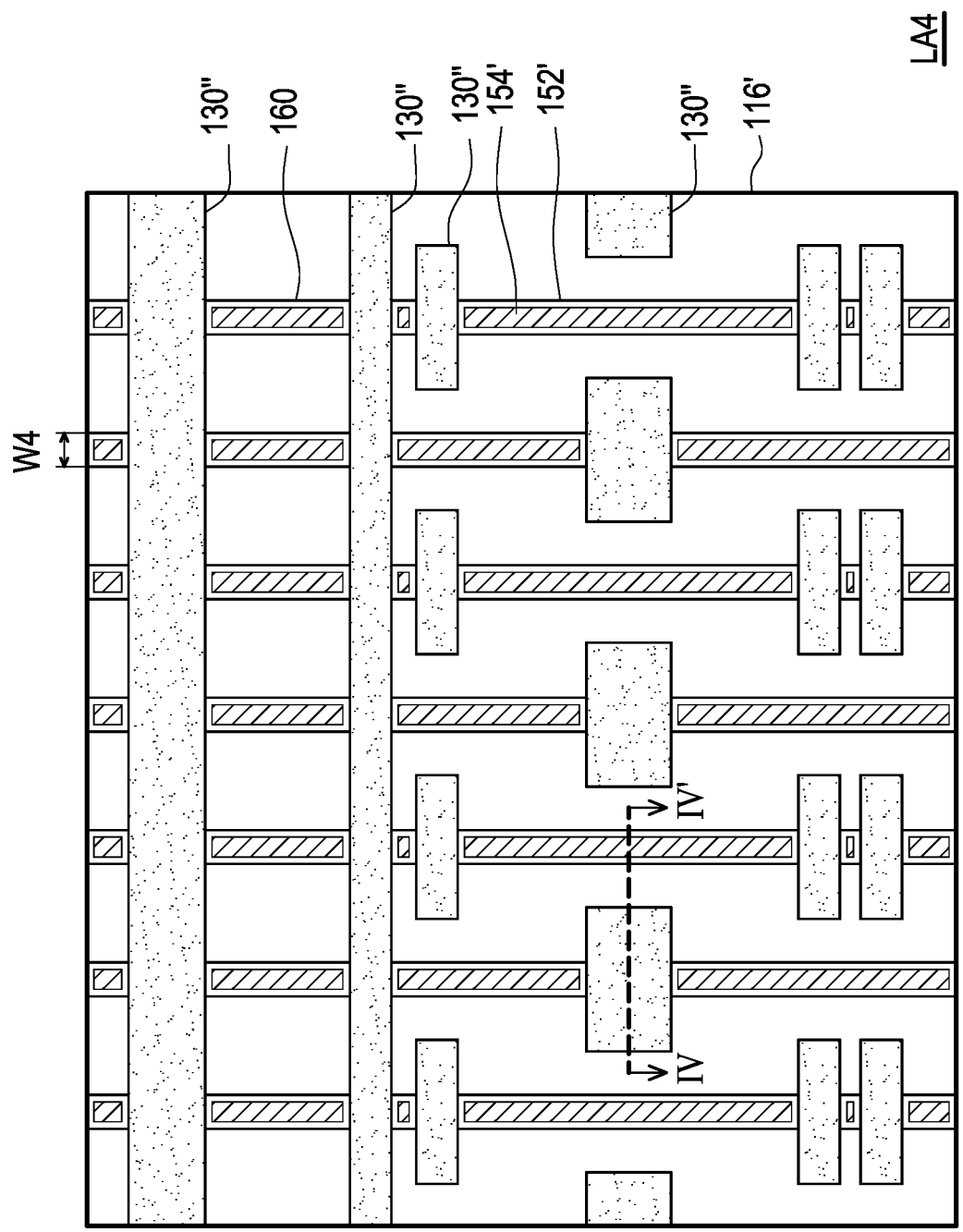

Referring to FIG. 14 and FIG. 15 together, the exemplary top view of FIG. 15 illustrates the relative layout of the devices, and the cross-sectional view of FIG. 14 is taken along the cross-section line IV-IV' shown in FIG. 15. The fourth layout LA4 of FIG. 15 only shows arrangements of the remaining ILD layer 116', the remaining hard mask structures 130" and the contact structures 160 for illustration purposes, and some elements may be omitted for simplicity and clarity. As seen from FIG. 15, arrangements of the contact structures 160 are similar to the arrangements of the slot openings 146 shown in FIG. 10, and arrangements of the remaining hard mask structures 130" are similar to the arrangements of the hard mask structures 130 shown in FIG. 10.

According to the aforementioned process steps, the second opening portions 146P2 are etched into through-holes and further filled with the adhesive layers 152 and the conductive layers 154, so that the contact structures 160 are formed at positions below these portions. Since the hard mask structures 130 have high etching selectivity and are able to act as a mask during the etching process for forming the through-holes, the first opening portions 146P1 are not etched to form the contact structures 160. In other words, the slot openings 146 transfer the most part of the patterns (i.e., the second opening portions 146P2) to the underlying layers to form the through-holes (where the contact structures 160 are formed later), except for the portions (i.e., the first opening portions 146P1) blocked by the hard mask structures 130. Hence, from a top view as illustrated in FIG. 15, multiple segment (e.g., slot or line segments) contact structures 160 extending in the Y-direction are formed, and two contact segment structures 160 adjacent in the Y-direction are separated from each other by one remaining hard mask structure 130. In these cases, the remaining hard mask structures 130" may be referred to as the "contact cut features" or "separators (contact separators)" as they function like cutting or separating the contact structures 160 into two or more segments.

As illustrated in FIG. 15, depending on the designed arrangements of the hard mask structures 130, the separators (i.e., the remaining hard mask structures 130") may inherit the arrangements and patterns of the hard mask structures 130 and thus include block top-view shapes, strip top-view shapes, or a combination thereof. In embodiments where the separator has a strip top-view shape, the separator extends between multiple pairs of contact segment structures 160 arranged in parallel in the X-direction, and two of each pair are located on opposite sides of the separator. In embodiments where the separator has a block top-view shape, the separator extends between one pair of contact segment structure 160, and the pair of contact segment structure 160 is located on opposite sides of the separator. However, the block-shaped separator may extend between two or more pairs of contact segment structure 160 according to the design requirements. In general, each contact segment structure 160 is in contact with the separators at its two ends (e.g., line ends in the Y-direction).

In addition, the block-shaped separator and the neighboring contact segment structure 160 are spaced apart with each other by a spacing S2 (see FIG. 14 which corresponds to the dashed line IV-IV' in FIG. 15). In an embodiment, the spacing S2 is in a range of between about 17 nm to 25 nm. At cross-section along the dashed line IV-IV, according to some embodiments, the contact structure 160 include a top width W4 and the remaining hard mask structure 130" (i.e., separator) include a top width W5. In an embodiment, the top width W4 of the contact structure 160 is in a range of between about 16 nm to 18 nm, and the top width W5 of the remaining hard mask structure 130" is in a range of between about 21 nm to 26 nm. In some other embodiments, the plurality of contact structures 160 includes the same top width W4 for process convenience. Alternatively, the contact structures 160 may include different top width.

Up to here, a middle-end-of-line (MEOL) portion 10M of the semiconductor device 10 is formed. The MEOL portion 10M includes the insulating layer 114, the remaining ILD layer 116', the remaining hard mask structures 130", and the contact structures 160. A MEOL portion of a semiconductor device generally includes contact structures that connect to the conductive features (or conductive regions) of the devices embedded in the FEOL portion, for example, contact structures to the source/drain structures. As illustrated in FIG. 14, the contact structure 160 is in physical contact with the source/drain structures 114 such that an electrical connection is established between the contact structure 160 and the source/drain structures 114.

Figure 16:
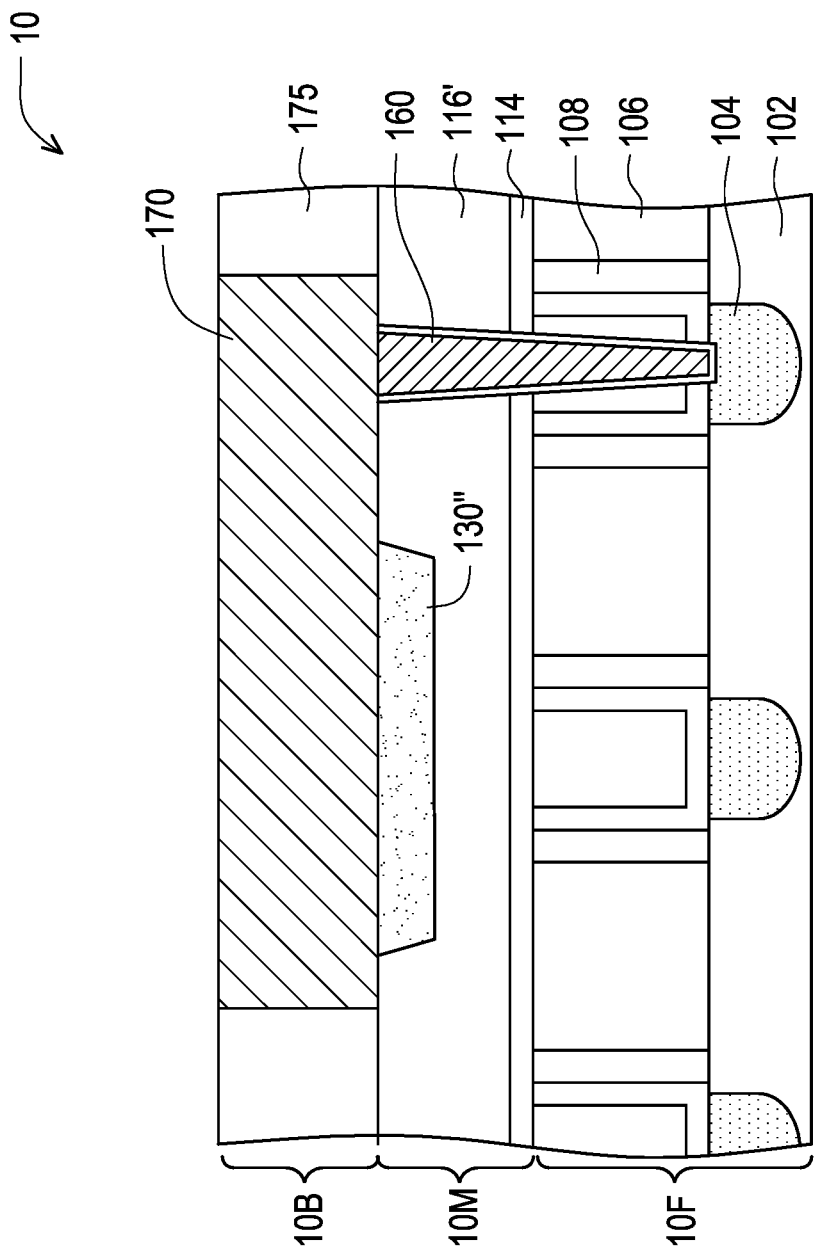

Referring to FIG. 16, a back-end-of-line (BEOL) portion 10B of the semiconductor device 10 is formed over the MEOL portion 10M. The BEOL portion generally includes a plurality of interconnect layers each comprising an ILD layer 175 and a conductive pattern 170 (e.g., metallization lines) embedded in the dielectric layer 175. The interconnect layers of the BEOL interconnects IC devices of the FEOL portion and contact structures of the MEOL portion, thereby enabling operation of the semiconductor device. It is understood that one interconnect layer (including one conductive pattern 170 and one ILD layer 175) is shown in FIG. 16 merely for clarity and simplicity. In some embodiments, the ILD layer 175 is formed of similar materials through similar processes of the ILD layer 116 as described above. In some embodiments, the conductive pattern 170 includes conductive material such as copper, aluminum copper, aluminum, tungsten, some other metal or conductive material, or a combination thereof. The conductive pattern 170 may be formed in the ILD layer 175 using single-damascene process or a dual-damascene process.

FIG. 17 through FIG. 22 are schematic cross-sectional views and an exemplary layout at various stages in the formation of contact structures of a semiconductor device in accordance with some embodiments of the disclosure. It is noted that the processes and structures provided in FIG. 17 through FIG. 22 are very similar to those described above with reference to FIG. 1 through FIG. 16, hence the similarities are not discussed in detail and only differences are emphasized.

Figure 17:
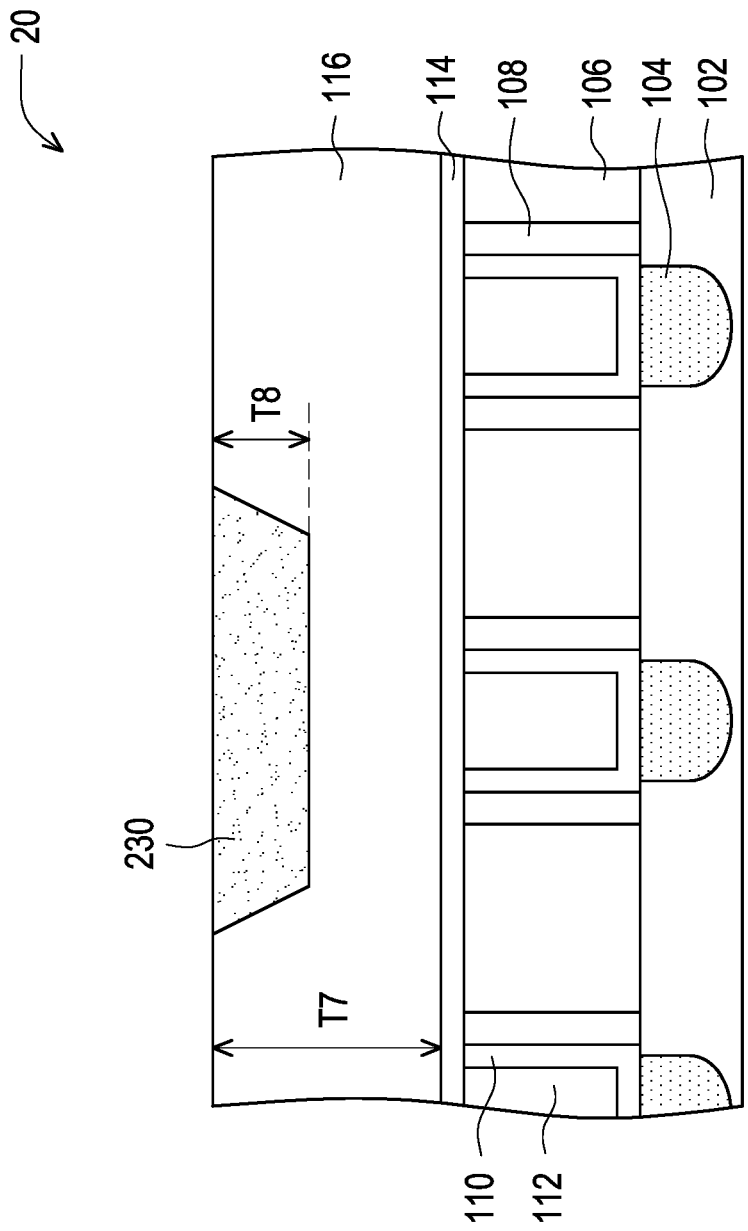
FIG. 17 through FIG. 22 are schematic cross-sectional views and an exemplary layout at various stages in the formation of contact structures of a semiconductor device in accordance with some embodiments of the disclosure.

Referring to FIG. 17, the semiconductor device 20 shown in FIG. 17 is similar to the semiconductor device 10 shown in FIG. 5, the only difference between the two lies in the thickness of the hard mask structure. For example, in embodiments where a thickness T7 of the ILD layer 116 is about 70 nm, the hard mask structure 230 embedded in the ILD layer 116 has a thickness T8 which is less than about 40 nm. It is noted that the arrangements of the hard mask structures 230 may be the same as those discussed above with reference to FIG. 6.

Figure 18:
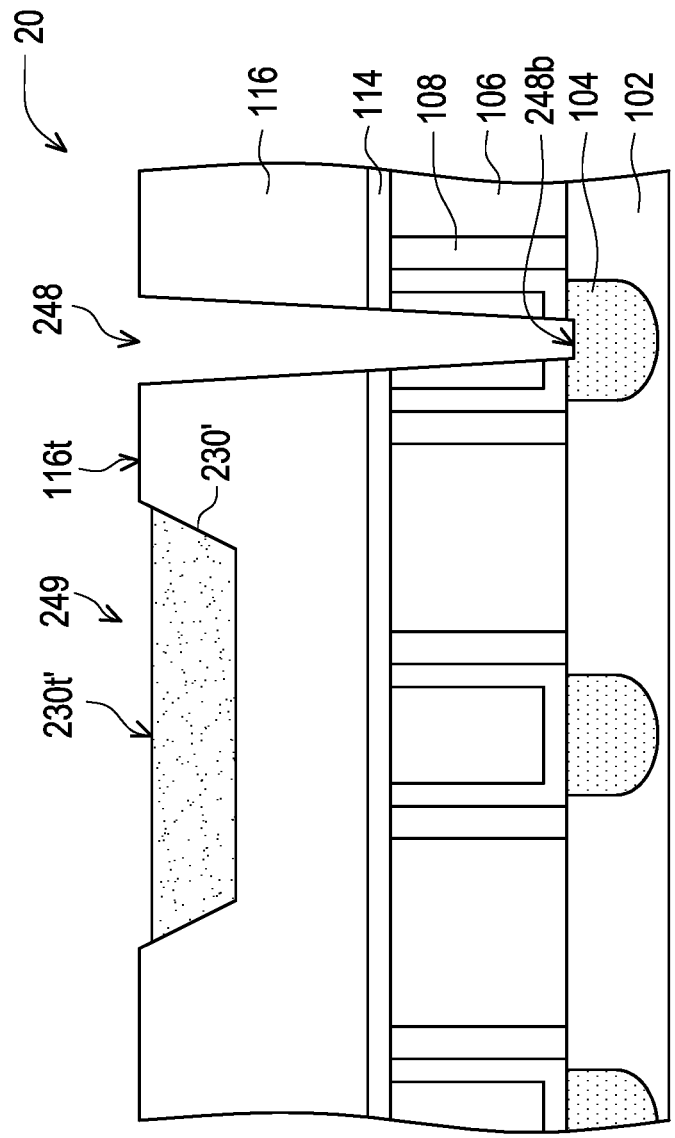

Referring to FIG. 18, multiple processes (e.g., layer deposition processes, etching processes) are performed on the structure shown in FIG. 17 to form a through-hole 248 for accommodating later-formed contact structure; the processes are the same as those discussed above with reference to FIG. 7 through FIG. 12 and the description is not repeated herein. As shown in FIG. 18, the through-hole 248 penetrates through the ILD layer 116, the insulating layer 114, the dielectric structure 112, and the insulating layer 110 and into the substrate 102. A bottom surface 248b may be at a lower level compared to the top surface of the substrate 102. Further, the hard mask structure 230 is slightly recessed such that a recess 249 is formed. That is, a top surface 230t' of the etched hard mask structure 230' is located lower than a top surface 116t of the ILD layer 116.

Figure 19:
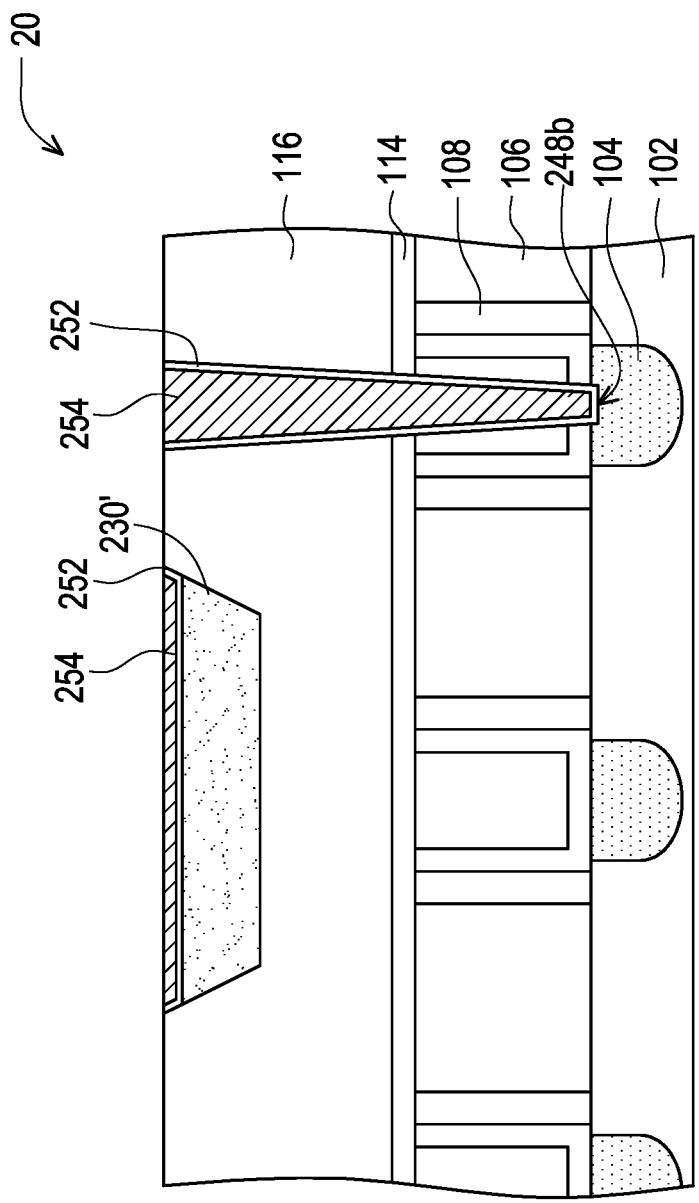

Referring to FIG. 19, adhesive layers 252 and conductive layers 254 are filled in the through-hole 248 and the recess 249. Materials and methods for forming the adhesive layers 252 and the conductive layers 254 are similar to those of the adhesive layers 152 and the conductive layers 154 as described above with reference to FIG. 13 and the description is not repeated herein.

Figure 20:
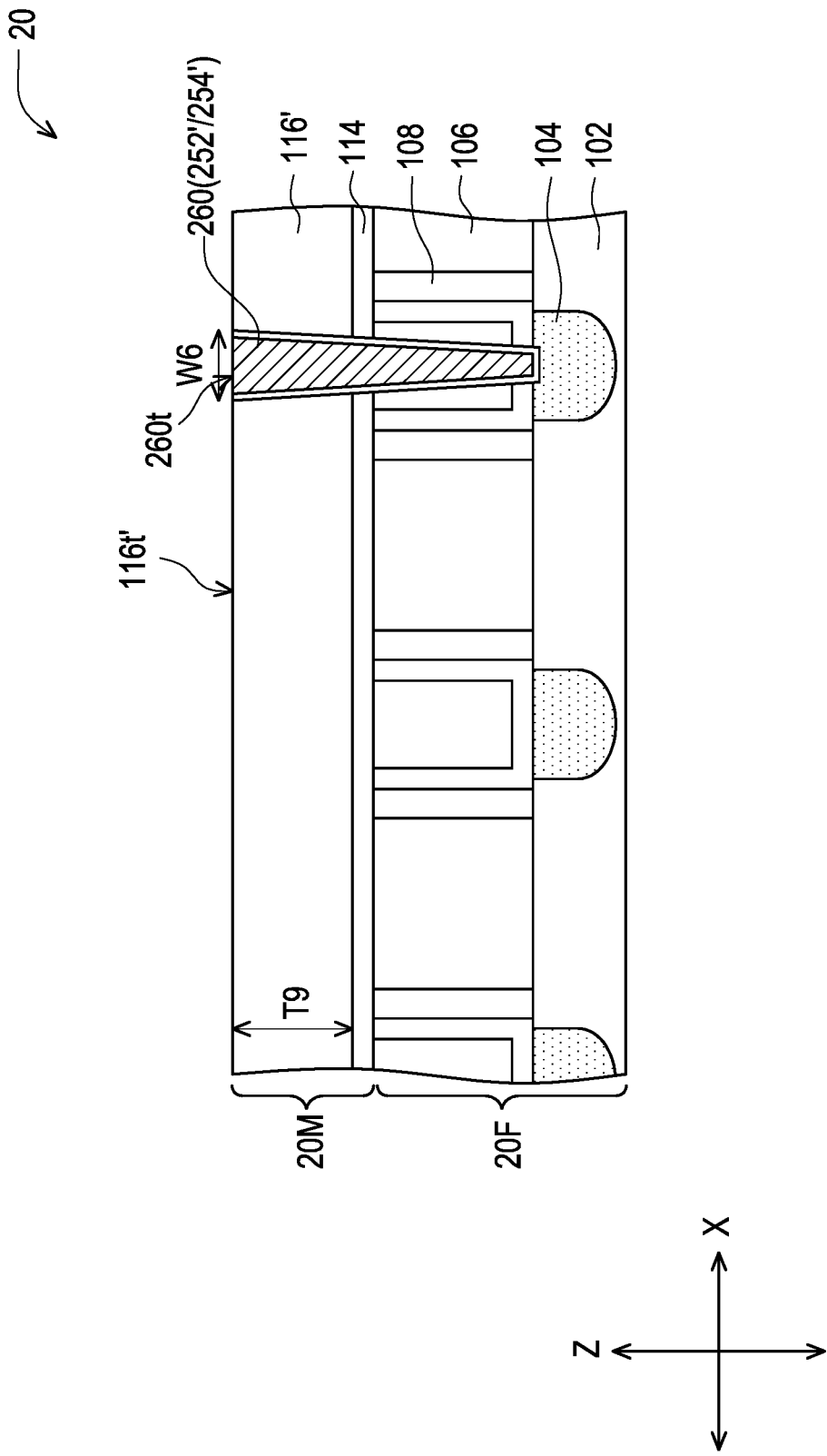
Figure 21:
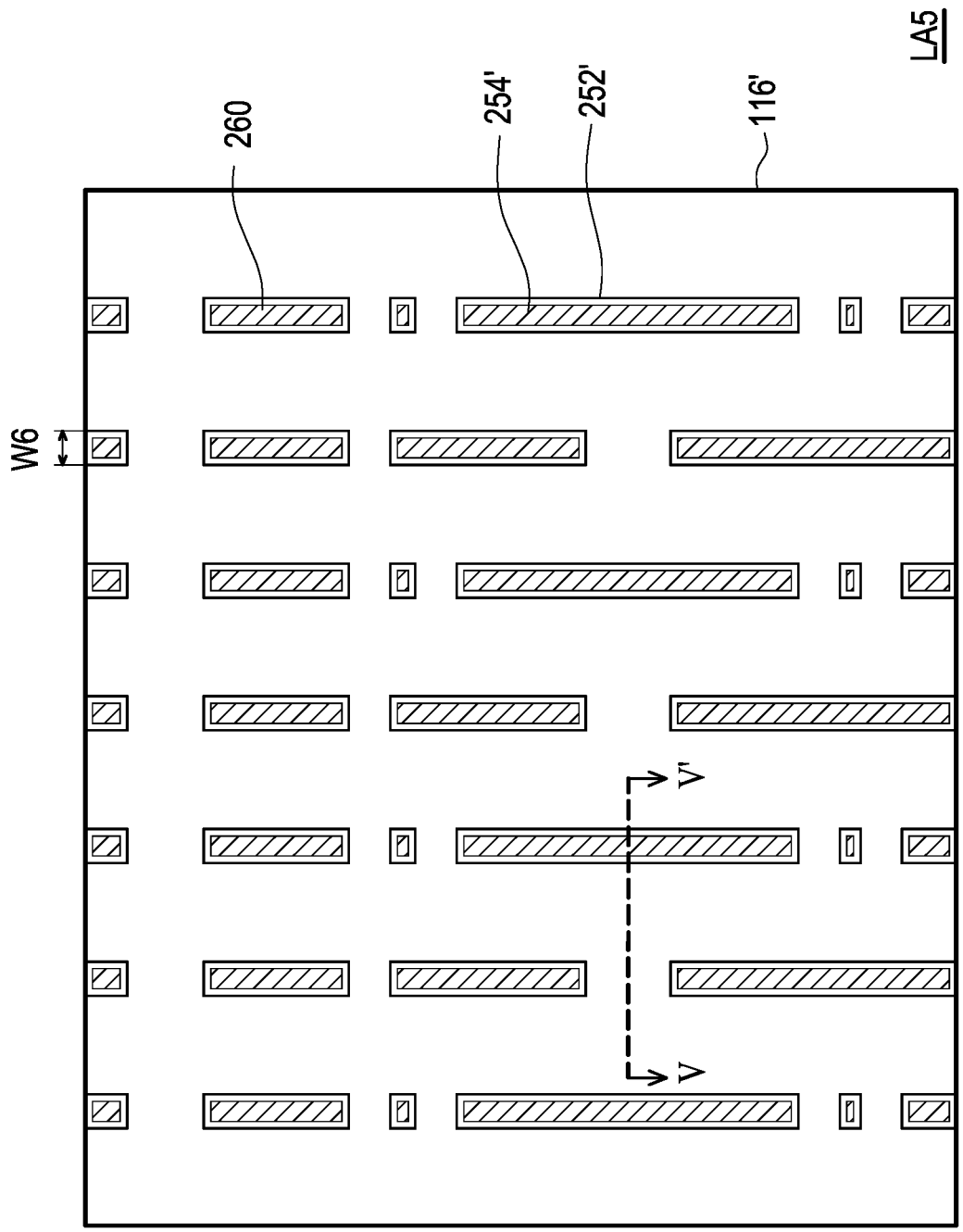

Referring to FIG. 20, a planarization process such as CMP or grinding process is performed on the structure shown in FIG. 19. In some embodiments, the ILD layer 116 is thinned down to a desired thickness T9 after the planarization process. For example, the thickness T9 is about 18 nm. The remaining adhesive layer 252' and the remaining conductive layer 254' are collectively formed into a conductive structure 260. In some embodiments, a top width W6 of the conductive structure 260 is in a range of between about 16 nm to about 18 nm. As shown in FIG. 20, a top surface 260t of the conductive structure 260 is coplanar to and levelled with a top surface 116t' of the remaining ILD layer 116'. Similarly, the top-view shapes and the arrangements of the conductive structure 260 are similar to those of the conductive structure 160 (see FIG.

Since an original thickness of the hard mask structure 230 (e.g., less than about nm) is smaller than the original thickness of the hard mask structure 130 (e.g., greater than about 50 nm), the hard mask structure 230 will be fully removed after the planarization process. Hence, as illustrated in fifth layout LA5 of FIG. 21, there is no hard mask material left between two conductive structures 260 adjacent in the Y-direction.

Figure 22:
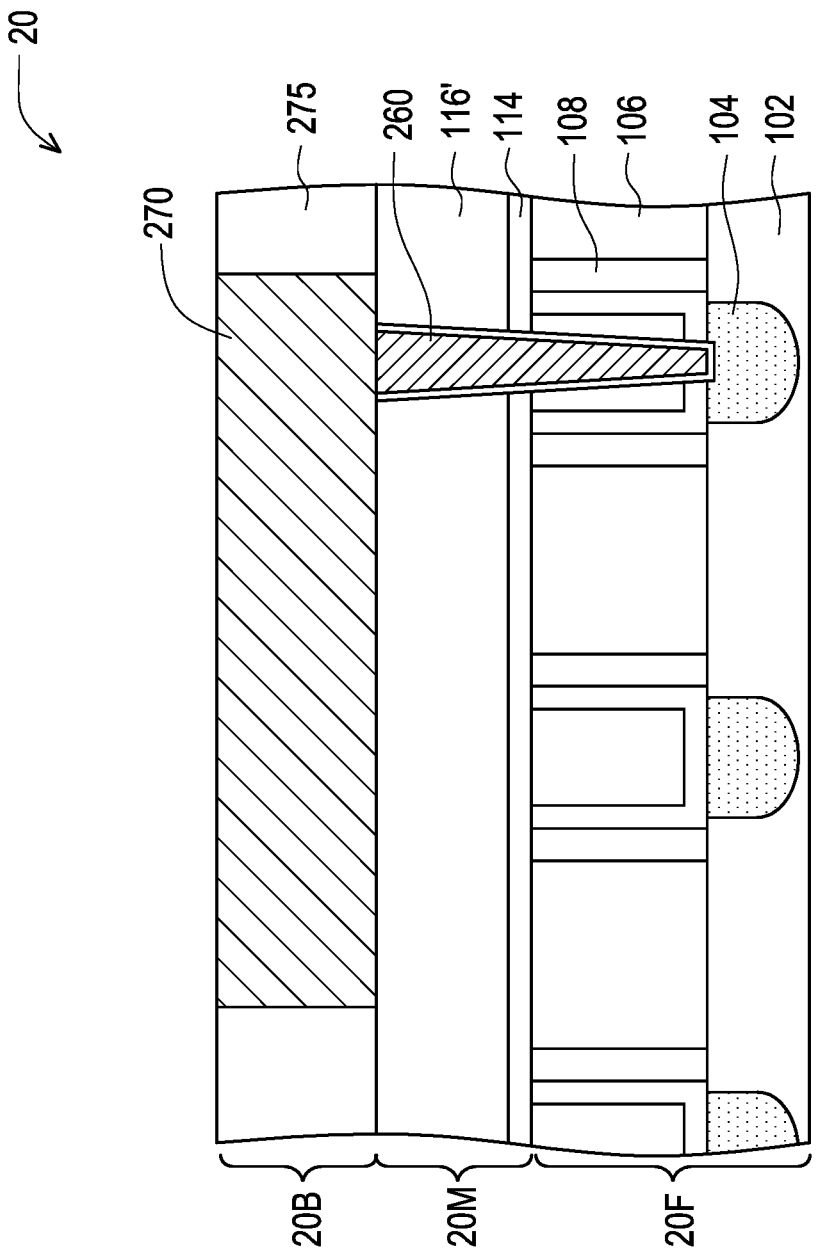

Referring to FIG. 22, a BEOL portion 20B of the semiconductor device 20 is formed on a MEOL portion 20M which includes the insulating layer 114, the remaining ILD layer 116' and the conductive structure 260. The BEOL portion 20B is very similar to the BEOL portion 10B of the semiconductor device 10 as described above with reference to FIG. 16, for example, the BEOL portion 20B includes a plurality of interconnect layers each comprising an ILD layer 275 and a conductive pattern 270 which are respectively similar to the ILD layer 175 and the conductive pattern 170 of the BEOL portion 10B, thus the details are not repeated herein.

In accordance with an embodiment of the disclosure, a semiconductor device is described. The semiconductor device includes a substrate, gate structures that extend on the substrate along a first direction and are arranged in a second direction in parallel with one another, source and drain regions that are disposed in the substrate between the parallel gate structures, and dielectric structures that are disposed on the substrate and between the gate structures, wherein the first direction is perpendicular to the second direction. An ILD layer is disposed over the gate structures and the dielectric structures. The semiconductor device further includes contact structures that are disposed beside and between the parallel gate structures and separators that are embedded in the ILD layer, wherein each contact structure extends vertically through the ILD layer and the dielectric structures, and the separators are disposed above the gate structures and disposed beside the contact structures. Each contact structure extends along the first direction and extends between two adjacent separators, and each separator extending in the second direction overlaps at least two adjacent gate structures.

In accordance with another embodiment of the disclosure, a method of manufacturing a semiconductor device is described. The method includes at least the following steps. Forming a device structure including source and drain structures and gate structures disposed between the source and drain structures. Forming a first dielectric layer over the device structure. Forming hard mask structures embedded in the first dielectric layer. Forming a barrier layer and a second dielectric layer over the first dielectric layer and the hard mask structures. Forming slot openings penetrating through the barrier layer and the second dielectric layer, wherein the slot openings extend along a first direction and across the hard mask structures, and the slot openings are formed in parallel beside and between the gate structures and spaced apart from one another in a second direction, wherein the slot openings include first opening portion exposing the hard mask structures and second opening portions exposing the first dielectric layer. Forming through-holes in the second opening portions penetrating through the first dielectric layer and portions of the device structure to expose surfaces of the source and drain structures, the through-holes are formed by etching down the second opening portions of the slot openings. Forming contact structures by filling the through-holes with a conductive material, wherein the contact structures are in contact with the source and drain structures of the device structure.

In accordance with yet another embodiment of the disclosure, a method of manufacturing a semiconductor device is described. The method includes at least the following steps. Forming source and drain structures in a substrate. Forming gate structures over the substrate, wherein the gate structures are beside the source and drain structures. Forming dielectric structures over the source and drain structures between the gate structures. Forming an inter-layer dielectric (ILD) layer over the gate structures and the dielectric structures. Etching the ILD layer to form first openings. Depositing metal oxide material over the ILD layer to fill up the first openings. Partially removing the metal oxide material to form metal oxide structures in the first openings of the ILD layer. Depositing a barrier layer over the metal oxide structures and the ILD layer. Depositing a dielectric layer on the barrier layer. Forming second openings by etching through the barrier layer and the dielectric layer, wherein the second openings are formed in parallel beside and between the gate structures, and the second openings include first opening portions and second opening portions, top surfaces of the metal oxide structures are exposed by the first opening portions of the second openings and top surfaces of the ILD layer are exposed by second opening portions of the second openings. Forming through-holes by etching through the ILD layer and the dielectric structures at locations of the second opening portions to expose the source and drain structures. Removing the barrier layer and the dielectric layer. Forming contact plugs that contact the source and drain structures by filling conductive material in the through-holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device comprising:
    forming a device structure including source and drain structures and gate structures disposed between the source and drain structures;
    forming a first dielectric layer over the device structure;
    forming hard mask structures embedded in the first dielectric layer;
    forming a barrier layer and a second dielectric layer over the first dielectric layer and the hard mask structures;
    forming slot openings penetrating through the barrier layer and the second dielectric layer, wherein the slot openings extend along a first direction and across the hard mask structures, and the slot openings are formed in parallel beside and between the gate structures and spaced apart from one another in a second direction, wherein the slot openings include first opening portion exposing the hard mask structures and second opening portions exposing the first dielectric layer;
    forming through-holes in the second opening portions penetrating through the first dielectric layer and portions of the device structure to expose surfaces of the source and drain structures, the through-holes are formed by etching down the second opening portions of the slot openings; and
    forming contact structures by filling the through-holes with a conductive material, wherein the contact structures are in contact with the source and drain structures of the device structure.

2. The method of claim 1, wherein forming the hard mask structures comprises:
    forming openings in the first dielectric layer;
    depositing a hard mask material over the first dielectric layer to fill up the openings; and
    performing a planarizing process to partially remove the hard mask material to form the hard mask structures in the openings, wherein top surfaces of the hard mask structures are coplanar to a top surface of the first dielectric layer.

3. The method of claim 1, wherein the barrier layer and the second dielectric layer are removed during forming the through-holes.

4. The method of claim 3, wherein each of the hard mask structures is etched to form a recess during forming the through-holes, and the recesses are filled with the conductive material during filling the through-holes with the conductive material.

5. The method of claim 4, further comprising:
    performing a planarization process to thin down the first dielectric layer and to fully remove the hard mask structures.

6. The method of claim 4, further comprising:
    performing a planarization process to thin down the first dielectric layer and to partially remove the hard mask structures, wherein top surfaces of remained hard mask structures, the first dielectric layer, and the contact structures are coplanar to one another after the planarization process.

7. The method of claim 4, wherein filling the through-holes with the conductive material comprises:

conformally depositing an adhesion material on surfaces of the through-holes and a surface of the first dielectric layer;

depositing a metal material on the adhesion layers; and performing another planarization process to remove the adhesion material and the metal material until the surface of the first dielectric layer is exposed.

8. A method of forming a semiconductor device comprising:

forming source and drain structures in a substrate;

forming gate structures over the substrate, wherein the gate structures are beside the source and drain structures;

forming dielectric structures over the source and drain structures between the gate structures;

forming an inter-layer dielectric (ILD) layer over the gate structures and the dielectric structures;

etching the ILD layer to form first openings;

depositing a metal oxide material over the ILD layer to fill up the first openings;

partially removing the metal oxide material to form metal oxide structures in the first openings of the ILD layer;

depositing a barrier layer over the metal oxide structures and the ILD layer;

depositing a dielectric layer on the barrier layer;

forming second openings by etching through the barrier layer and the dielectric layer, wherein the second openings are formed in parallel beside and between the gate structures, and the second openings include first opening portions and second opening portions, top surfaces of the metal oxide structures are exposed by the first opening portions of the second openings and top surfaces of the ILD layer are exposed by second opening portions of the second openings;

forming through-holes by etching through the ILD layer and the dielectric structures at locations of the second opening portions of the second openings to expose the source and drain structures;

removing the barrier layer and the dielectric layer; and forming contact plugs that contact the source and drain structures by filling a conductive material in the through-holes.

9. The method of claim 8, further comprising:

performing a planarization process to the conductive material such that top surfaces of the contact plugs are coplanar to a top surface of the ILD layer.

10. The method of claim 9, wherein performing the planarization process further includes removing the metal oxide structures.

11. The method of claim 8, wherein the contact plugs are electrically connected to the source and drain structures.

12. A method of forming a semiconductor device, comprising:

providing a substrate;

forming source/drain regions within the substrate;

forming gate structures over the substrate and between adjacent source/drain regions;

forming dielectric structures between adjacent gate structures and insulating structures around the dielectric structures;

forming a dielectric layer on top surfaces of the gate structures, the insulating structures, and the dielectric structures;

partially removing the dielectric layer resulting in first recesses laterally between the adjacent gate structures;

depositing a hard mask material filling into the first recesses to form hard mask structures;

forming a though hole opening aside the hard mask structures, wherein the through hole opening extends through the dielectric layer, the dielectric structure, and the insulating structure, thereby revealing a top surface of the source/drain regions;

forming a through hole connector within the through hole opening and abutting the source/drain regions.

13. The method of claim 12, further comprising forming an insulating layer between the dielectric layer and the gate structures.

14. The method of claim 13, wherein forming the through hole opening comprises performing a first etching process that etches through the dielectric layer and stops on the insulating layer, and performing a second etching process that etches through the insulating layer, the dielectric structure, and the insulating structure.

15. The method of claim 12, further comprising etching off top portions of the hard mask structures to form second recesses after forming the through hole opening, and top surfaces of the etched hard mask structures are below a top surface of the dielectric layer.

16. The method of claim 15, further comprising concurrently depositing a conductive material into the second recesses and the through hole opening.

17. The method of claim 16, further comprising depositing an adhesive layer in the second recesses, and the through hole opening, prior to depositing the conductive material, such that the adhesive layer conforms to the profiles of the second recesses and the through hole opening.

18. The method of claim 12, further comprising forming an inter-layer dielectric (ILD) layer over the dielectric layer.

19. The method of claim 18, further comprising embedding a conductive pattern within the ILD layer, such that the through hole connector is in contact with the conductive pattern.

20. The method of claim 19, further comprising performing a removal process to thin down the dielectric layer, prior to forming the ILD layer, wherein remaining portions of the hard mask material and through hole connector are covered by the conductive pattern.

* * * * *